(12) United States Patent
Lemkin et al.

(10) Patent No.: US 9,496,840 B2
(45) Date of Patent: Nov. 15, 2016

(54) RADIO RECEIVER

(71) Applicant: Linear Technology Corporation, Milpitas, CA (US)

(72) Inventors: Mark Alan Lemkin, Berkeley, CA (US); Thor Nelson Juneau, Menlo Park, CA (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 0 days.

(21) Appl. No.: 14/714,155

(22) Filed: May 15, 2015

(65) Prior Publication Data

US 2015/0333718 A1 Nov. 19, 2015

Related U.S. Application Data

(60) Provisional application No. 61/994,671, filed on May 16, 2014.

(51) Int. Cl.

| | |
|---|---|
| *H04B 1/26* | (2006.01) |
| *H04B 1/16* | (2006.01) |
| *H03G 3/20* | (2006.01) |
| *H04B 1/30* | (2006.01) |

(52) U.S. Cl.
CPC ............... *H03G 3/20* (2013.01); *H04B 1/16* (2013.01); *H04B 1/30* (2013.01)

(58) Field of Classification Search
CPC ............ H04B 1/16; H04B 1/30; H03G 3/20
USPC .................................. 455/323, 334, 337–338
See application file for complete search history.

(56) References Cited

U.S. PATENT DOCUMENTS

| | | |
|---|---|---|
| 5,594,939 A | 1/1997 | Curello et al. |
| 6,292,474 B1 | 9/2001 | Ali et al. |

(Continued)

FOREIGN PATENT DOCUMENTS

| | | |
|---|---|---|
| CN | 101183878 A | 5/2008 |
| EP | 2 688 215 A1 | 1/2014 |

(Continued)

OTHER PUBLICATIONS

U.S. Notice of Allowance issued in related U.S. Appl. No. 13/550,033, mailed on Sep. 14, 2015.

(Continued)

*Primary Examiner* — Lee Nguyen
(74) *Attorney, Agent, or Firm* — McDermott Will & Emery LLP

(57) ABSTRACT

A baseband signal-conditioning architecture applicable to radio receivers uses switched-capacitor techniques to provide high-performance signal conditioning in low-voltage, deep-submicron processes (e.g., 65 nm and below). In the architecture, a first mixer is coupled to an antenna receiving the signal, and outputs a first mixer output signal based on the signal received by the antenna. A buffer coupled to an output of the first mixer outputs a buffer signal based on the first mixer output signal. A first charge pump is coupled to an output of the buffer, and produces a first charge pump output signal based on the buffer signal. In some examples, a second charge pump is coupled to the output of the first mixer and produces a second charge pump output signal based on the first mixer output signal, and the buffer input is coupled to an output of the second charge pump.

20 Claims, 18 Drawing Sheets

(56) References Cited

U.S. PATENT DOCUMENTS

| | | | |
|---|---|---|---|
| 7,418,250 | B2 | 8/2008 | Igarashi et al. |
| 7,512,083 | B2 | 3/2009 | Li |
| 7,881,679 | B1 | 2/2011 | Faravash et al. |
| 8,086,208 | B2 | 12/2011 | Cook et al. |
| 2003/0011861 | A1 | 1/2003 | Casagrande |
| 2006/0035611 | A1 | 2/2006 | Connell et al. |
| 2010/0285769 | A1 | 11/2010 | Conroy et al. |
| 2011/0026507 | A1 | 2/2011 | Katsube et al. |
| 2011/0092180 | A1 | 4/2011 | Chen et al. |
| 2011/0124307 | A1 | 5/2011 | Balankutty et al. |
| 2012/0133800 | A1 | 5/2012 | Jung et al. |
| 2012/0139591 | A1 | 6/2012 | Ozeki |
| 2013/0015831 | A1* | 1/2013 | Wong ............ H01G 5/40 323/282 |
| 2014/0018028 | A1 | 1/2014 | Lemkin et al. |
| 2015/0333718 | A1 | 11/2015 | Lemkin et al. |

FOREIGN PATENT DOCUMENTS

| | | |
|---|---|---|
| TW | 200616360 | 5/2006 |
| TW | I279111 B | 4/2007 |
| TW | 201223138 A | 6/2012 |

OTHER PUBLICATIONS

Extended European Search Report issued in European Patent Application No. EP 15001492.6, mailed on Sep. 15, 2015.

U.S. Office Action issued in related U.S. Appl. No. 13/550,033, mailed on Aug. 5, 2013; 7 pages.

U.S. Office Action issued in related U.S. Appl. No. 13/550,033, mailed on Feb. 14, 2014; 7 pages.

U.S. Office Action issued in related U.S. Appl. No. 13/550,033, mailed on Aug. 29, 2014; 10 pages.

Extended European Search Report issued in European Patent Application No. EP 13003571.0 dated Nov. 19, 2013.

K. Wang et al., "A Low-Loss Image-Reject Mixer Using Source Follower Isolation Method for DRM/DAB Tuner Applications," IEEE Transactions on Circuits and Systems II: Express Briefs, vol. 58, No. 11, Nov. 2011.

S. Zhou et al., "A CMOS Passive Mixer With Low Flicker Noise for Low-Power Direct-Conversion Receiver," IEEE Journal of Solid-State Circuits, vol. 40, No. 5, May 2005.

T. Chang et al., "ESD-Protected Wideband CMOS LNAs Using Modified Resistive Feedback Techniques With Chip-on-Board Packaging," IEEE Transactions on Microwave Theory and Techniques, vol. 56, No. 8, Aug. 2008.

M. Vidojkovic et al., "A 1.2V Receiver Front-End for Multi-Standard Wireless Applications in 65 nm CMOS LP," Solid-State Circuits Conference, 2008. ESSCIRC 2008. Sep. 15-19, 2008, pp. 414-417.

D. Im et al., "A CMOS Resistive Feedback Differential Low-Noise Amplifier With Enhanced Loop Gain for Digital TV Tuner Applications," IEEE Transactions on Microwave Theory and Techniques, vol. 57, No. 11, Nov. 2009.

B.W. Cook et al., "SoC Issues for RF Smart Dust," Proceedings of the IEEE, vol. 94, No. 6, Jun. 2006.

B.W. Cook, Low Energy RF Transceiver Design, Electrical Engineering and Computer Sciences, University of California at Berkeley, Technical Report No. UCB/EECS-2007-57, May 16, 2007.

C. Andrews et al., "Implications of Passive Mixer Transparency for Impedance Matching and Noise Figure in Passive Mixer-First Receivers," IEEE Transactions on Circuits and Systems—I: Regular Papers, vol. 57, No. 12, Dec. 2010.

D. Im et al., "A Broadband CMOS RF Front-End for Universal Tuners Supporting Multi-Standard Terrestrial and Cable Broadcasts," IEEE Journal of Solid-State Circuits, vol. 47, No. 2, Feb. 2012.

C. Andrews et al., "A Passive Mixer-First Receiver With Digitally Controlled and Widely Tunable RF Interface," IEEE Journal of Solid-State Circuits, vol. 45, No. 12, Dec. 2010.

B.W. Cook et al., "Low-Power 2.4-GHz Transceiver With Passive RX Front-End and 400-mV Supply," IEEE Journal of Solid-State Circuits, vol. 41, No. 12, Dec. 2006.

Taiwanese Office Action issued in Taiwanese Patent Application No. 102125414, mailed on Dec. 24, 2014; 14 pages with English translation.

J. Kim, et al. "Low-Power, Low-Cost CMOS Direct-Conversion Receiver Front-End for Multistandard Applications," IEEE Journal of Solid-State Circuits, vol. 48. No. 9; Sep. 2013.

U.S. Office Action dated Jun. 3, 2016, issued in U.S. Appl. No. 14/981,755.

Taiwanese Office Action dated Jan. 13, 2016, issued in related Taiwanese Application No. 102125414. (w/ English translation).

Chinese Office Action dated Jul. 4, 2016, issued in Chinese Application No. 201310298631.1. (w/ English translation).

\* cited by examiner

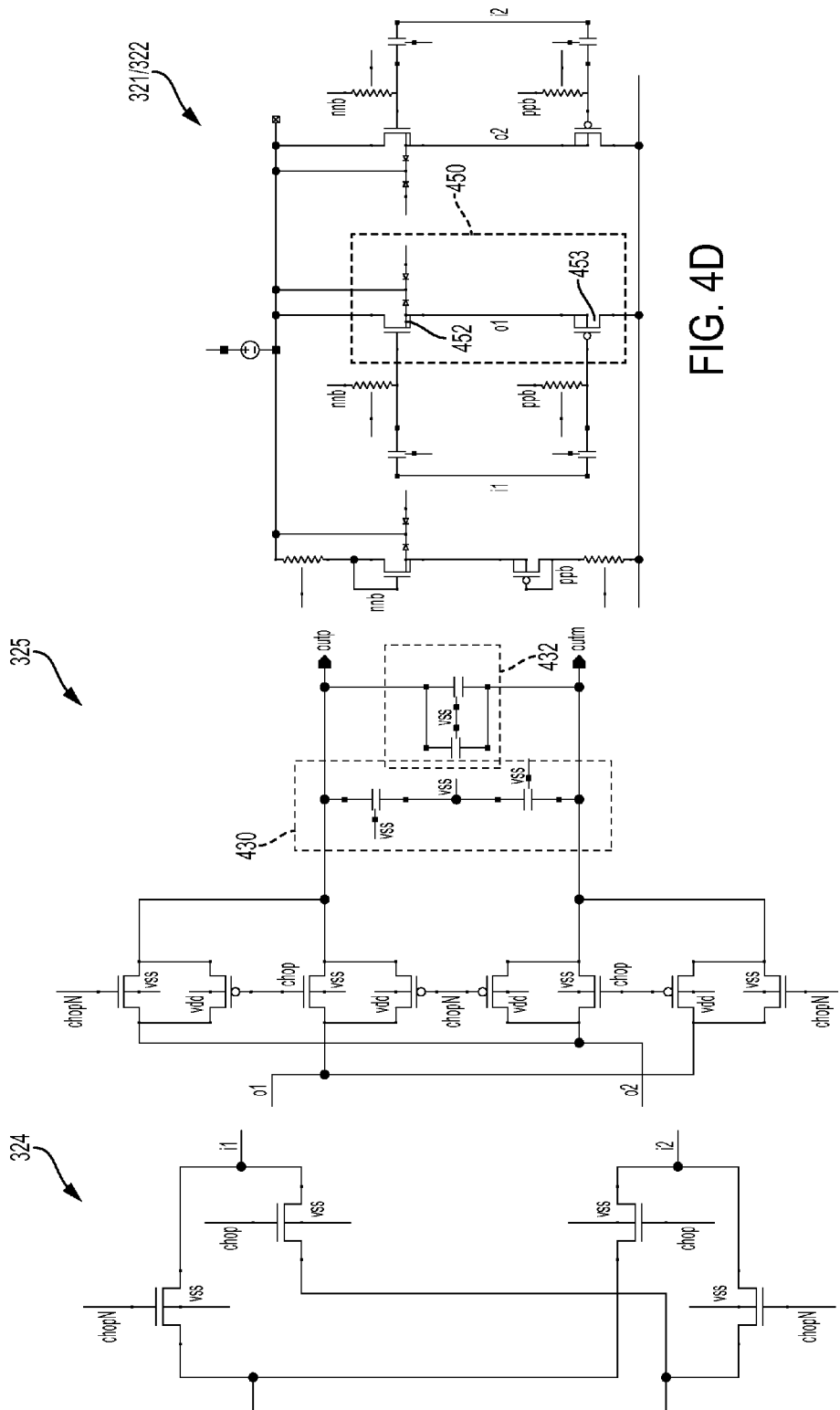

FIG. 8F

| Device | Param | Noise Contribution | % Of Total |
|---|---|---|---|
| /PORT1 | rn | 4.7861e-14 | 35.44 |
| /I1/T6 | id | 6.71818e-15 | 4.97 |
| /T4 | id | 4.74736e-15 | 3.52 |
| /T5 | id | 4.74487e-15 | 3.51 |
| /I1/T7 | id | 4.28135e-15 | 3.17 |
| /I56/T112 | id | 2.80826e-15 | 2.08 |
| /I56/T235 | id | 2.79053e-15 | 2.07 |
| /L0 | rn | 2.4603e-15 | 1.82 |
| /I56/T115 | id | 1.23265e-15 | 0.91 |
| /I56/T239 | id | 1.22704e-15 | 0.91 |
| /I56/T3 | id | 1.00938e-15 | 0.75 |
| /I56/T0 | id | 1.00934e-15 | 0.75 |
| /I56/T254 | id | 8.81894e-16 | 0.65 |
| /I56/T253 | id | 8.7932e-16 | 0.65 |
| /I56/T252 | id | 8.78204e-16 | 0.65 |
| /I56/T255 | id | 8.7797e-16 | 0.65 |
| /I56/T106 | id | 8.37203e-16 | 0.62 |
| /I56/T241 | id | 8.30658e-16 | 0.62 |
| /I57/T253 | id | 8.27161e-16 | 0.61 |
| /I57/T254 | id | 8.26721e-16 | 0.61 |

- /I1/T6 → LNB NFET
- /T4, /T5 → Mixer switches
- /I1/T7 → LNB PFET
- /I56/T112, /I56/T235 → First stage charge pump $C_{filt}$ sample switches
- /L0 → Inductor Match ESR Spot Noise Summary (in V^2/Hz) at 1M Hz Sorted By Noise Contributors
Total Summarized Noise = 1.35051e-13
Total Input Referred Noise = 1.11251e-18
The above noise summary info is for pnoise data

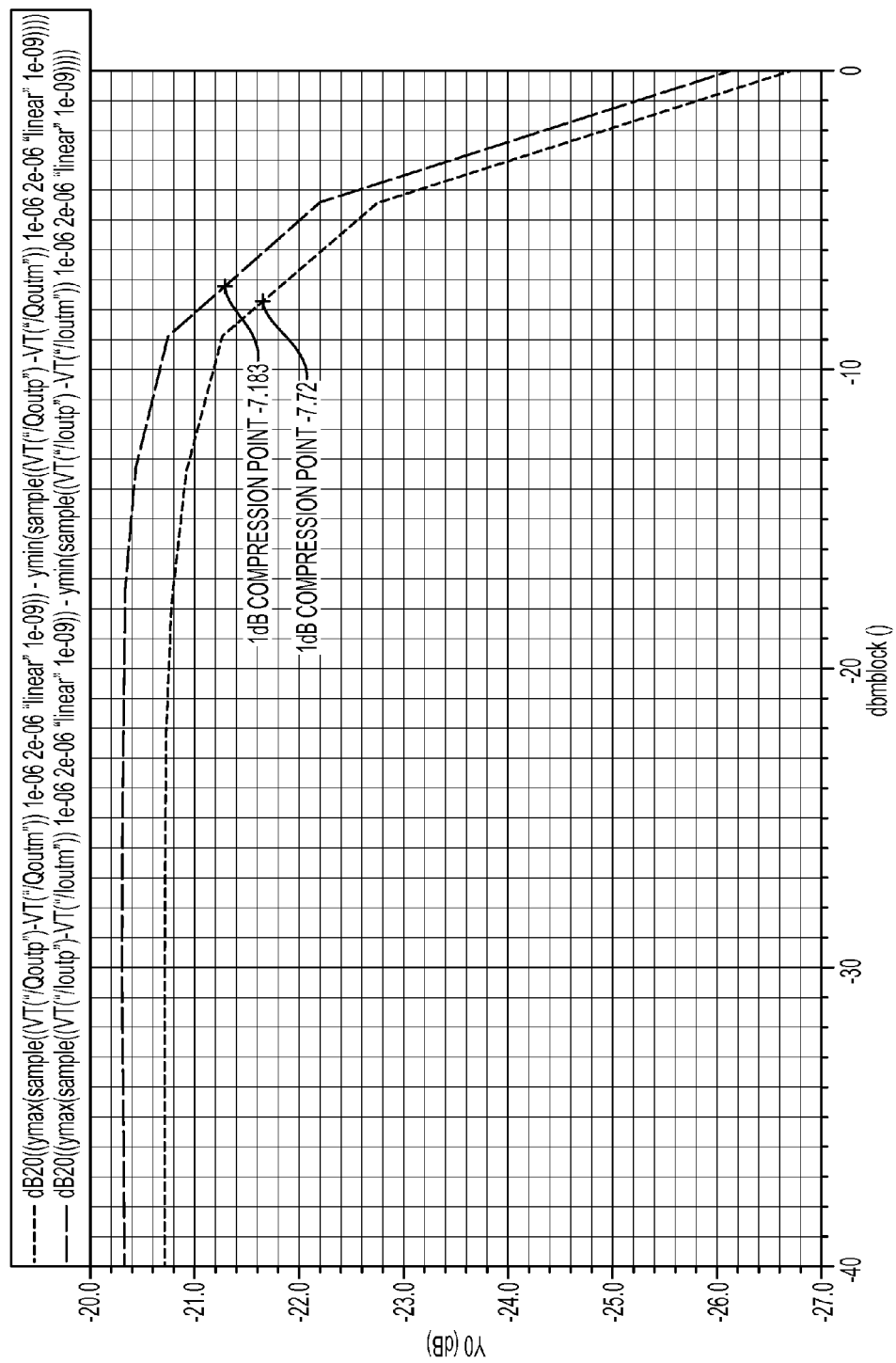

RADIO RECEIVER

CROSS-REFERENCE TO RELATED APPLICATION

This application claims the benefit of U.S. Provisional Application No. 61/994,671, filed on May 16, 2014 in the U.S. Patent and Trademark Office, the disclosure of which is incorporated by reference herein in its entirety.

BACKGROUND

Designing a radio receiver using conventional architectures in integrated circuit fabrication technologies with feature sizes of 65 nm and less presents substantial challenges. These challenges include limited dynamic range due to low supply voltage, low intrinsic voltage gain from transistors, high flicker noise corner, difficulty in cascoding transistors due to headroom issues, and the general squirrely behavior of field effect transistors (FETs) in these processes.

A need therefore exists for improved radio receiver architectures that can provide high performance even in fabrication technologies with small feature sizes.

SUMMARY

The teachings herein alleviate one or more of the above noted problems with established radio receivers.

In accordance with one illustrative embodiment, a radio receiver includes an antenna configured to receive a signal, a first mixer, a buffer, and a first charge pump. The first mixer is coupled to the antenna and is configured to output a first mixer output signal based on the signal received by the antenna. The buffer has a buffer input coupled to an output of the first mixer and is configured to output at a buffer output a buffer signal based on the first mixer output signal. The first charge pump is coupled to the buffer output and is configured to produce a first charge pump output signal based on the buffer signal.

The radio receiver may further include a second charge pump that is coupled to the output of the first mixer and that is configured to produce a second charge pump output signal based on the first mixer output signal. The buffer input may be coupled to an output of the second charge pump and the buffer may be configured to output at the buffer output the buffer signal based on the second charge pump output signal that is itself based on the first mixer output signal.

The first and second charge pumps may be switched-capacitor charge pumps each having a plurality of sampling capacitors.

The second charge pump may be configured to sample the first mixer output signal on each of the plurality of sampling capacitors of the second charge pump on a periodic basis during a sampling time interval, and to reconfigure the plurality of sampling capacitors in series at an output of the second charge pump on the periodic basis during an output time interval.

The first mixer, the first charge pump, and the second charge pump may each receive a differential signal at an input thereof and may each output a differential signal at an output thereof.

The radio receiver may further include a chopper stabilization circuit that is coupled between the output of the second charge pump and an input of the first charge pump and including the buffer.

The first charge pump may further include a capacitive circuit having an adjustable capacitance that is coupled between a plurality of sampling capacitors of the first change pump and the output of the first charge pump. The adjustable capacitance may be configured to be adjusted to adjust a bandwidth of the first charge pump.

The radio receiver may further include a third charge pump that is coupled to an output of the first charge pump and that is configured to produce a third charge pump output signal based on the first charge pump output signal. At least one of the first, second, and third charge pumps may have an adjustable gain.

The third charge pump may have the adjustable gain, the third charge pump may have a plurality of sampling capacitors, and the third charge pump may be configured to sample the first charge pump output signal on a selectable subset of the plurality of sampling capacitors selected according to a value of the adjustable gain, and to connect all of the plurality of sampling capacitors in series at an output of the third charge pump during an output time interval.

The radio receiver may further include a second mixer that is coupled the antenna and that is configured to output a second mixer output signal based on the signal received by the antenna. The first mixer output signal may be an in-phase component of the signal received by the antenna and the second mixer output signal may be a quadrature-phase component of the signal received by the antenna. The radio receiver may also include a fourth charge pump that is coupled to an output of the second mixer and that is configured to produce a fourth charge pump output signal based on the second mixer output signal.

In accordance with a further aspect of the disclosure, a method is provided in which a wireless signal is received in an antenna. The signal received by the antenna is mixed to produce a first mixer output signal in a first mixer coupled to the antenna. A signal based on the first mixer output signal is buffered in a buffer coupled to an output of the first mixer. The buffered signal is processed in a first charge pump coupled to an output of the buffer to produce a first charge pump output signal based on the buffered signal.

The method may further include processing the first mixer output signal in a second charge pump coupled to the output of the first mixer to produce a second charge pump output signal based on the first mixer output signal. The buffering of the signal based on the first mixer output signal may include buffering the second charge pump output signal that is itself based on the first mixer output signal.

The processing of the first mixer output signal may include processing the first mixer output signal in a second switched-capacitor charge pump having a plurality of sampling capacitors, and the processing of the buffered signal may include processing the buffered second charge pump output signal in a first switched-capacitor charge pump having a plurality of sampling capacitors.

The processing of the first mixer output signal in the second switched-capacitor charge pump may include sampling the first mixer output signal on each of the plurality of sampling capacitors of the second charge pump on a periodic basis during a sampling time interval, and reconfiguring the plurality of sampling capacitors in series at an output of the second charge pump on the periodic basis during an output time interval.

The mixing of the signal received by the antenna may include producing a first mixer output signal that is a differential signal from the signal received by the antenna that is a single-ended signal.

The buffering of the second charge pump output signal in the buffer may further include processing the second charge pump output signal using a chopper stabilization circuit including the buffer.

The processing of the mixer output signal in the second charge pump may further include adjusting a bandwidth of the second charge pump by adjusting a capacitance of a capacitive circuit of the second charge pump that has an adjustable capacitance and that is coupled between a plurality of sampling capacitors of the second change pump and the output of the second charge pump.

The method may further include processing the first charge pump output signal in a third charge pump coupled to an output of the first charge pump to produce a third charge pump output signal based on the first charge pump output signal. The processing of the first charge pump output signal in the third charge pump may include adjusting an adjustable gain of the third charge pump.

The third charge pump may have a plurality of sampling capacitors. The processing of the first charge pump output signal in the third charge pump may include sampling the first charge pump output signal on a selectable subset of the plurality of sampling capacitors selected according to a value of the adjustable gain, and connecting all of the plurality of sampling capacitors in series at an output of the third charge pump during an output time interval.

The method may further include mixing the signal received by the antenna to produce a second mixer output signal in a second mixer coupled to the antenna. The first mixer output signal may be an in-phase component of the signal received by the antenna and the second mixer output signal may be a quadrature-phase component of the signal received by the antenna. The method may also include processing the second mixer output signal in a fourth charge pump coupled to an output of the second mixer to produce a fourth charge pump output signal.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIGS. 4A-4E are detailed circuit diagrams of an illustrative charge pump that may be used in a radio receiver such as that shown in FIGS. 3A-3C.

FIGS. 6 and 8A-8H are plots showing experimental measurements obtained from a radio receiver such as that shown in FIGS. 3A-3C.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

A radio receiver disclosed herein uses an unconventional architecture to provide high performance in integrated circuit fabrication technologies with small feature sizes (e.g., 65 nm or less). Specifically, transistors in fabrication technologies of 65 nm or less are both tiny and highly conductive. The combination of good conductivity with low gate capacitance enables new methods for signal-processing of radio frequency (RF) signals. As an example, a 100 um/0.055 um negative channel FET (NFET) driven as a switch with a 1.2 V gate-source voltage ($V_{GS}$) exhibits an drain-to-source on-resistance $R_{DS}$-on of about 5 Ohms, with a total gate capacitance of only 75 fF. Noise figure (NF) degradation of radio receivers is caused by excess thermal noise from dissipative elements (e.g., resistors) in the front end. In this radio architecture, the extremely low on-resistance of the very narrow FETs reduces the NF. As a result, the switches can be moved closer to the front end, thereby improving receiver performance.

Figure 1A:
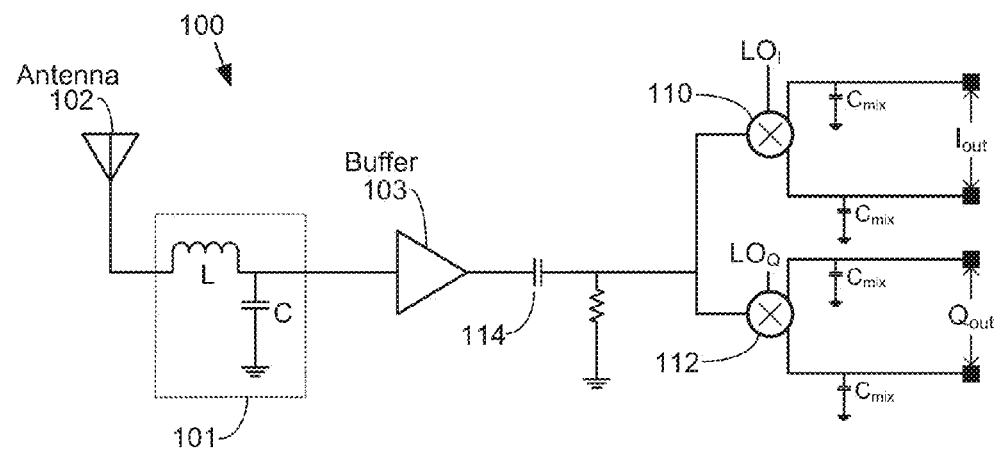
FIG. 1A is a high-level circuit diagram of an example of a radio receiver architecture.

In one example architecture shown in FIG. 1A, the radio receiver 100 has a signal path that starts with a passive matching network 101 connected directly to an antenna 102. An L-match is illustratively shown in the figure, but any other appropriate matching network 101 may be used. The passive matching network 101 provides voltage gain, and thereby increases the desired voltage at the input of the low-noise buffer (LNB) 103. The low noise buffer 103 generally has a voltage gain of 1 and provides impedance buffering. As a result, the impedance at the output of the LNB 103 is substantially decreased as compared to traditional radio receiver circuits in which the LNB 103 is replaced with a low-noise amplifier (LNA) which provides voltage gain from the input terminal. At the LNB's input terminal, the input-port noise (RMS) has been increased by the voltage gain of the resonant tank (neglecting noise from the match inductor L). Thus the equivalent noise resistance at the LNB input terminal increases by the square of the voltage gain. Therefore, increasing the voltage of the desired signal through a passive match relaxes the requirements for equivalent noise resistance and the associated power in the subsequent LNB 103.

Again referring to FIG. 1A, the LNB 103 has an output that is capacitively coupled by via capacitor $C_c$ 114 to two single-balanced passive mixers 110, 112. The mixers 110, 112 are driven in quadrature by respective local oscillator signals $LO_I$ and $LO_Q$. The differential outputs of the passive mixers 110, 112 are coupled via capacitors $C_{mix}$ to ground.

For the conversion to properly occur, a different common-mode capacitor $C_{mix}$ is placed at each output of the passive mixers 110, 112 because each single-balanced mixer converts a voltage with respect to ground to a differential signal with a common-mode component. A differential capacitance (e.g., coupled between two differential outputs of a same passive mixer 110, 112) may also optionally be included. The inputs to the mixers 110, 112 appear largely as open circuits (e.g., with very high impedance) for signals at the local oscillator (LO) frequency, and the impedance seen at the inputs becomes lower for frequencies distant from the center frequency due to the mixer output capacitance. This frequency-translated capacitance effect provides first-order filtering of the down-converted RF signals at the output of the mixers 110, 112 so that far-out interferers are immediately attenuated before gain is applied to the signal (other than the gain provided by the passive matching network 101). The result is improved blocking performance and attenuated aliasing into the subsequent first gain-stage sample bandwidth.

Figure 1B:
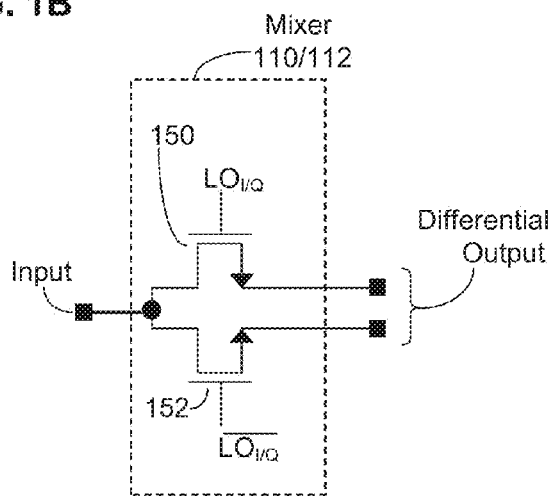
FIG. 1B is a detailed circuit diagram of an illustrative mixer architecture that may be used in a radio receiver such as that shown in FIG. 1A.

An illustrative architecture used for implementing the mixers 110, 112 is shown in FIG. 1B. As shown in FIG. 1B, each mixer 110 or 112 can be implemented using a pair of complementary FET devices 150, 152 having drain nodes connected together and to the input of the mixer, and having source nodes connected to respective differential output nodes of the mixer. Complementary local oscillator signals LO and $\overline{\text{LO}}$ respectively control the gate terminals of the devices 150 and 152. Other mixer architectures can also be used.

Figure 2:
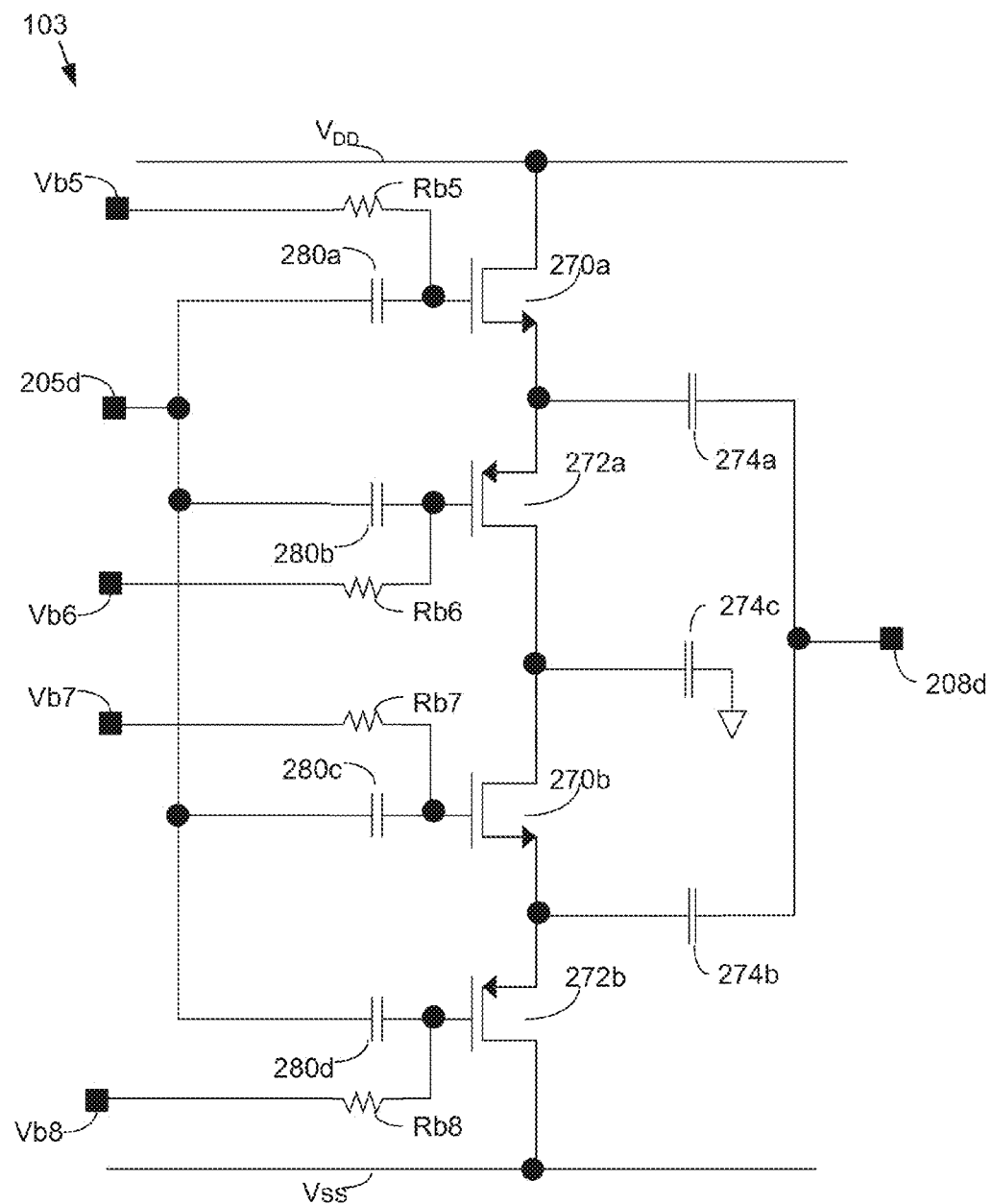
FIG. 2 is a detailed circuit diagram of an illustrative buffer that may be used in a radio receiver such as that shown in FIG. 1A.

In general, power consumption can be traded off for dynamic range in the front end. Specifically, two low-noise buffers (e.g., each made of PMOS/NMOS complementary source followers, with the sources pointed at each other) may be stacked on top of each other to reuse the current, as illustratively shown in the LNB 103 circuit of FIG. 2. While this architecture halves the bias current needed to power the LNB 103 while maintaining a constant NF, the output swing of each buffer in the architecture will be reduced. However, in many applications, the reduced output swing does not matter because the input signal at the front end is of small amplitude, even in the presence of blockers.

The receiver 100 is ideally suited for a direct-conversion architecture because the architecture intrinsically has low flicker noise and offset due to the passive, switched-capacitor operating techniques used. Furthermore, in addition to addressing the image-rejection problem, a direct-conversion architecture provides an improved 3 dB noise figure over a low-IF (intermediate frequency) or IF architecture (double-sideband (DSB) vs. single-sideband (SSB) NF). This reduced noise bandwidth translates to additional performance that may be traded off between power and sensitivity as desired.

Figure 3A:
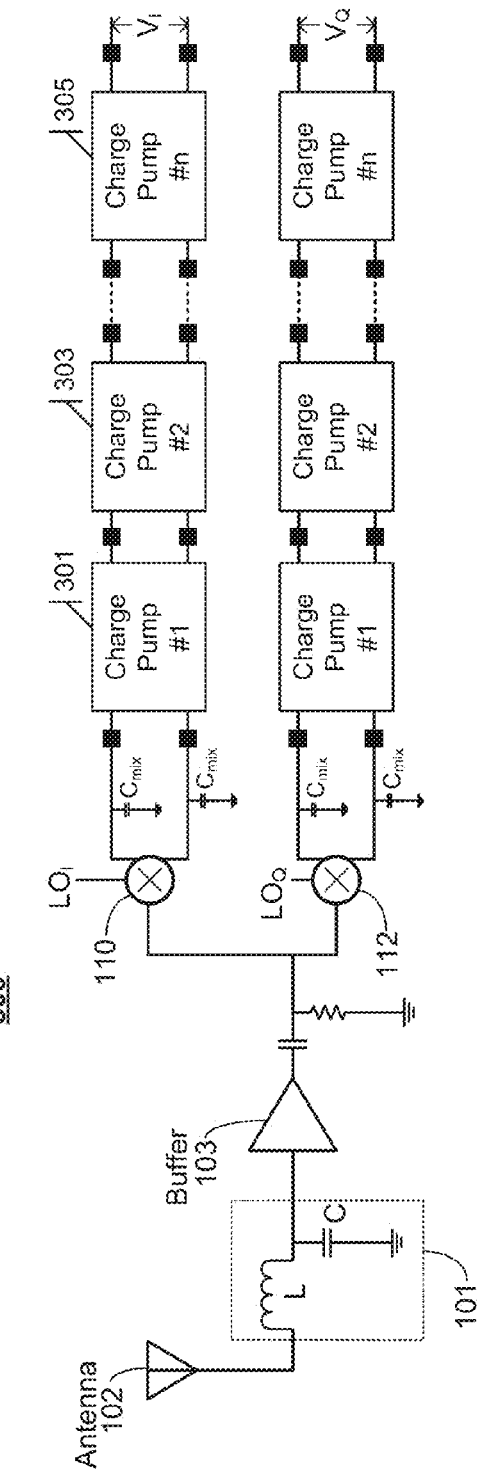
FIGS. 3A-3C are high-level circuit diagrams of an improved radio receiver architecture.

The low-impedance output from the LNB 103 is coupled to the highly-conductive passive-mixer switches 150, 152 that provide a large drive capability at the passive mixer output. As shown in FIG. 3A, charge pumps can be coupled to the outputs (e.g., the differential outputs) of the mixers 110, 112. By coupling a charge pump (e.g., 301) to the output of mixer 110, the voltage at the mixer output may be passively increased through operation of the charge pump 301, thereby obviating the need for a low-noise amplifier (LNA) operating at the baseband frequency. In this manner, the power, linearity, and noise requirements imposed on such a LNA are obviated. Instead, the passive amplification provided by the charge pumps (e.g., 301-305) add no additional noise beyond thermal noise (e.g., kT/C noise) of the capacitors in the charge pump. The charge pumps also have the ability to amplify the signals linearly with rail-to-rail (or greater) output voltages, thereby increasing the dynamic range of the receivers 100/300.

Figure 3C:
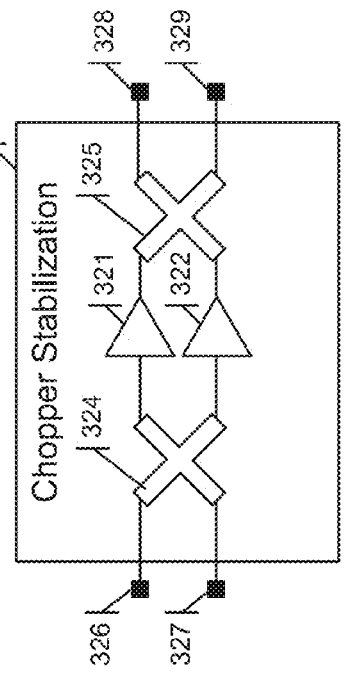
Figure 3B:
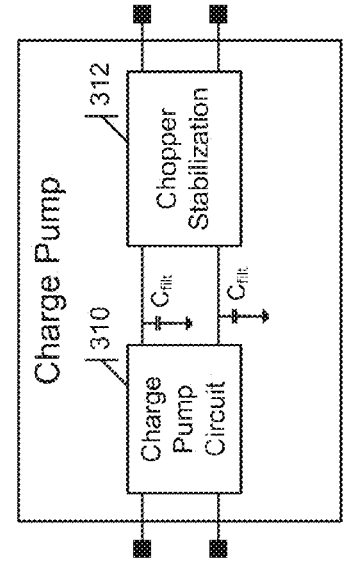
Figure 4A:
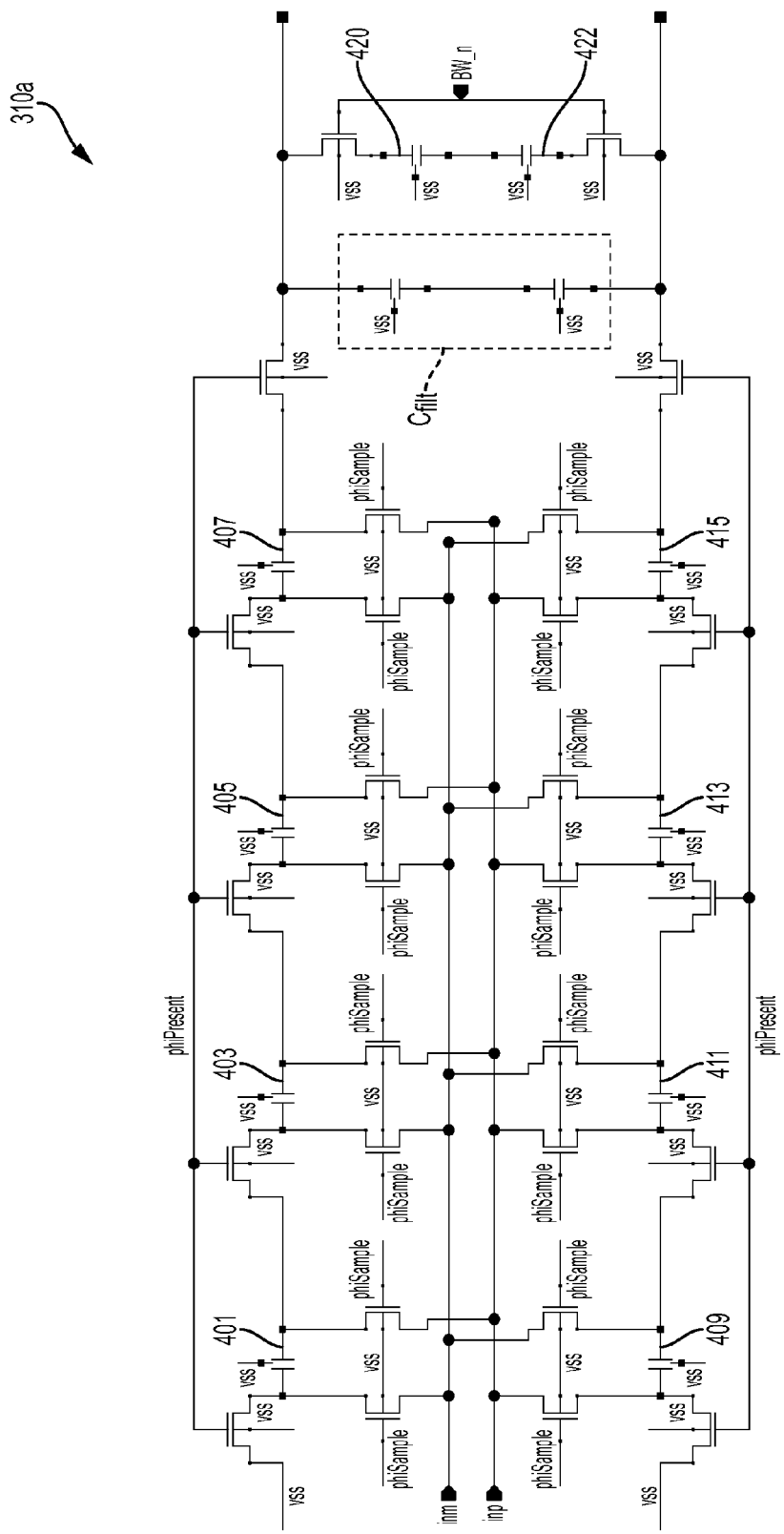

The structure of further circuitry coupled to outputs of the passive mixers 110, 112 is shown in FIGS. 3A-3C, 4A-4E, and 5A-5C. Specifically, FIG. 3A shows a radio receiver 300 substantially similar to radio receiver 100 shown in FIG. 1A, and additionally including charge pumps (301-305) coupled to outputs of the mixers 110, 112. In radio receiver 300, outputs of each of the differential mixers 110, 112 are directly coupled to respective series-combinations of charge pumps (e.g., series-combinations of three charge pumps are shown in FIG. 3A, although different numbers of charge pumps may be used in other embodiments). Further, in some embodiments, a first buffer can be coupled between the output of mixer 110 and the input of charge pump 301, and a second buffer can be coupled to the output of mixer 112 and another charge pump can be coupled to the output of the second buffer. The first charge pump 301 may be a switched-capacitor charge pump (SC-CP) that is directly coupled to outputs of differential mixer 110 or coupled to the outputs of differential mixer 110 via a buffer. A detailed circuit diagram of an SC-CP that can be used as charge pump 301 is shown in FIG. 4A. The SC-CP 310a of FIG. 4A is operative to sample differentially the mixer output capacitance (e.g., capacitors $C_{mix}$ of FIG. 3A) onto eight 5 pF sampling capacitors $C_S$. Four of the sampling capacitors $C_S$ are configured for positive sampling (e.g., capacitors 401, 403, 405, 407), and four other sampling capacitors $C_S$ are configured for negative sampling (e.g., capacitors 409, 411, 413, 415). Thus, a total of 40 pF of sampling capacitors is presented to the mixer output capacitors $C_{mix}$. Sampling is controlled by the signal phiSample which controls the gate terminals of sampling switches that connect each of the sampling capacitors $C_S$ 401-415 to the differential input nodes in$_m$ and in$_p$ of the charge pump 310a. After sampling has completed, the signal phiPresent causes the capacitors 401-415 to be re-configured in series into two banks of four caps: a first bank including capacitors 401-407 coupled in series to each other, and a second bank including capacitors 409-415 coupled in series to each other. A center node common to the two banks is connected to the common-mode level (vss in FIG. 4A). The reconfiguring of the capacitors provides a voltage gain of 8 to the output. The eight capacitors 401-415, which have an equivalent series capacitance of approximately 5 pF/8=0.625 pF, are then presented to a filter capacitor $C_{FILT}$ at the output of the charge pump 310a. Capacitor $C_{FILT}$ comprises two capacitors connected in series with the center terminal connected to ground (e.g., vss). This filter capacitor configuration provides a reasonable common-mode impedance as well as providing differential-mode filtering.

In the embodiment of FIG. 4A, the magnitude of the filter capacitor $C_{FILT}$ is selectable by the user via signal BW_n. Specifically, the filter capacitor $C_{FILT}$ is implemented as a capacitive circuit having an adjustable capacitance that can be adjusted to change the analog bandwidth of the receiver (i.e., pre-ADC conversion and before sampling and aliasing by subsequent stages). For this receiver, two settings are provided: 1) a low-bandwidth setting which may be used for operation in a 802.15.4-compliant mode with a 3 dB bandwidth of approximately 1.5 MHz, and 2) a higher-bandwidth setting for turbo-mode data rates of approximately 2.8 MHz. In the low-bandwidth setting, signal BW_n selects to add additional capacitors 420, 422 in parallel with $C_{FILT}$, so as to increase the total capacitance at the output node of the charge pump. In the higher-bandwidth setting, case capacitors 420 and 422 are not connected to $C_{FILT}$ by holding signal BW_n low.

As shown in FIG. 3B, a charge pump circuit (e.g., 301) can include both a charge pump circuit 310 followed in series with a chopper stabilization circuit 312, with the filter capacitor $C_{FILT}$ coupled to the nodes between the charge pump circuit 310 and chopper stabilization circuit 312. In some embodiments a noise and offset reduction technique other than chopper stabilization is used, for example by using a correlated double-sampling circuit (including a buffer) in place of the chopper stabilization circuit 312. The charge pump circuit 310a is one example of a charge pump circuit 310 shown in FIG. 3B. Additionally, the chopper stabilization circuit 312 is shown diagrammatically in FIG. 3C, and a particular circuit embodiment of a chopper stabilization circuit 312 is shown in detail in FIGS. 4B-4D. As shown in FIG. 3C, the chopper stabilization circuit 312 includes two buffers 321, 322 that are each coupled in a different one of the differential signal paths between the differential input and the differential output of the circuit 312. Alternatively, the chopper stabilization circuit can include a differential buffer including two buffer channels that are each coupled in a different one of the differential signal paths between the differential input and the differential output of the circuit 312. Further, switches 324 and 325 are operative to selectively route the input signals to one of the buffers 321, 322. For example, in a first state of operation, switches 324 and 325 may be operative to route a signal received at node 326 to buffer 321 and output 328, and to route a signal received at node 327 to buffer 322 and output 329. In a second state of operation, the switches 324 and 325 are operated to route the signal received at node 326 to buffer 322 and on to output 328, and to route the signal received at node 327 to buffer 321 and output 329. By alternating between the first and second states of operation, the chopper stabilization circuit 312 can minimize the effect of differences in the buffers 321 and 322 causing signal distortion at the outputs 328 and 329.

FIGS. 4B-4D show detailed circuit diagrams of elements of the chopper stabilization circuit. FIG. 4B shows an embodiment of the switches 324 which selectively couple to nodes i1 and i2 a different one of the input nodes depending on the state of the complementary control signals chop and chopN. FIG. 4C shows an embodiment of the switches 325 which selectively couple to nodes outp and outm a different one of the input nodes o1 and o2 depending on the state of the complementary control signals chop and chopN. FIG. 4C additionally shows sampling capacitors 430 and 432 that are used to store charge from the charge pump output between different charge pump stages (e.g., charge pump stages 301, 303, etc.). Finally, FIG. 4D shows an embodiment of buffers 321 and 322 respectively coupled between outputs i1 and i2 of switches 324 and inputs o1 and o2 of switches 325.

Figure 5A:
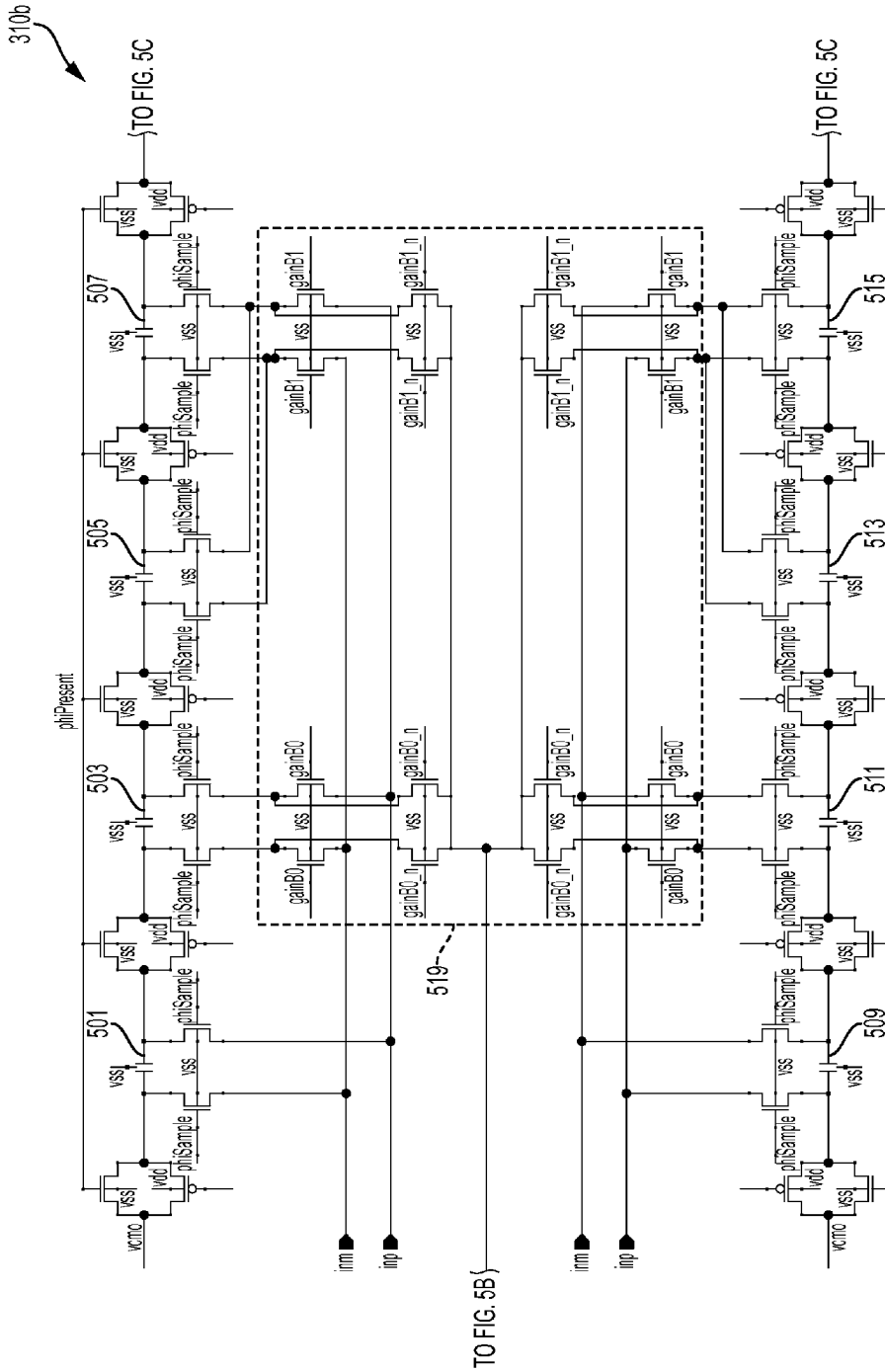
FIGS. 5A-5C are detailed circuit diagrams of another illustrative charge pump that may be used in a radio receiver such as that shown in FIGS. 3A-3C.
Figure 5C:
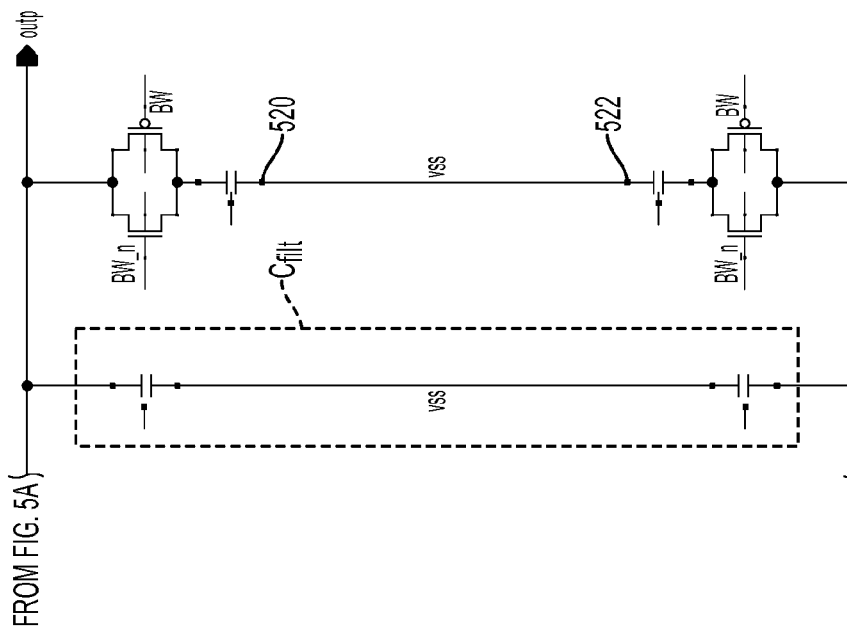
Figure 5B:
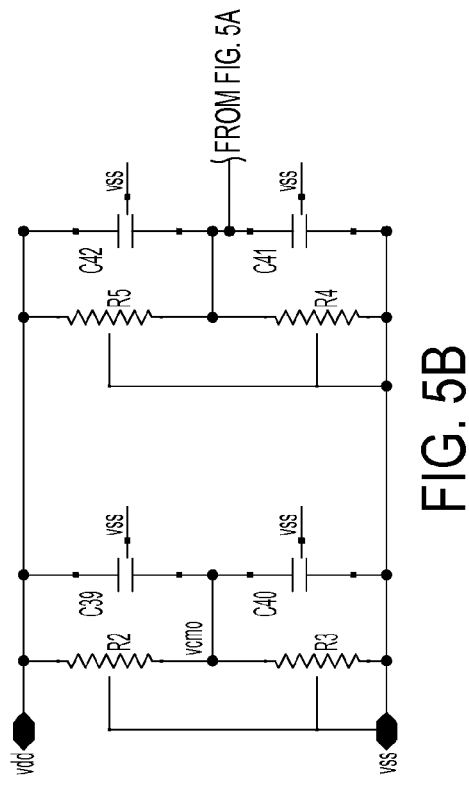

FIGS. 5A-5C show a detailed circuit schematic of a second illustrative SC-CP 310b. The charge pump 310b of FIGS. 5A-5C has a variable gain, and may in particular be used to implement a variable gain SC-CP as the last charge-pump stage 305 of radio receiver 300. In other embodiments, the SC-CP 310b can be used to implement any other charge pump stage (e.g., 301 or 303), or any combination of stages of the radio receiver 300.

The charge pump 310b has a structure generally similar to charge pump 310a of FIG. 4A. For example, charge pump 310b includes sampling capacitors 501-515 which operate substantially similarly to capacitors 401-415 of charge pump 310a. Input signals inm and inp are sampled onto sampling capacitors 501-515 when signal phiSample is high, and the capacitors 501-515 are connected in series in two banks when signal phiPresent is high. Capacitors $C_{filt}$, 520, and 522 shown in FIG. 5C operate substantially similarly to capacitors $C_{filt}$, 420, and 422 of FIG. 4A.

Additionally, the charge pump 310b includes gain selection circuitry 519 operative to selectively adjust the gain of the charge pump 310b. Specifically, as described above in relation to FIG. 4A, the charge pump 310a has a gain of eight (8) obtained by sampling the input signal onto eight capacitors 401-415, and coupling the capacitors in series for sampling onto capacitors $C_{filt}$. In charge pump 310b, the gain selection circuitry 519 selectively determines which of capacitors 501-515 receive samples of the input signal when the signal phiSample is high. Thus, instead of having the input signal sampled on all 8 capacitors 501-515, the input signal can be sampled on only a subset of the eight capacitors. Specifically, when signals gainB0 and gainB1 are high (and complementary signals gainB0_n and gainB0_n are low), the input signal is sampled onto all 8 capacitors 501-515. However, if signals gainB0 is low (and complementary signal gainB0_n is high), capacitors 503 and 511 do not receive input signal samples, but rather have their charge zeroed when phiSample is asserted. Similarly, if signals gainB1 is low (and complementary signal gainB1_n is high), capacitors 505, 507, 513, and 515 do not receive input signal samples, but likewise have their charge removed. The gain provided by the charge pump 310b is thus correspondingly reduced.

Figure 4E:
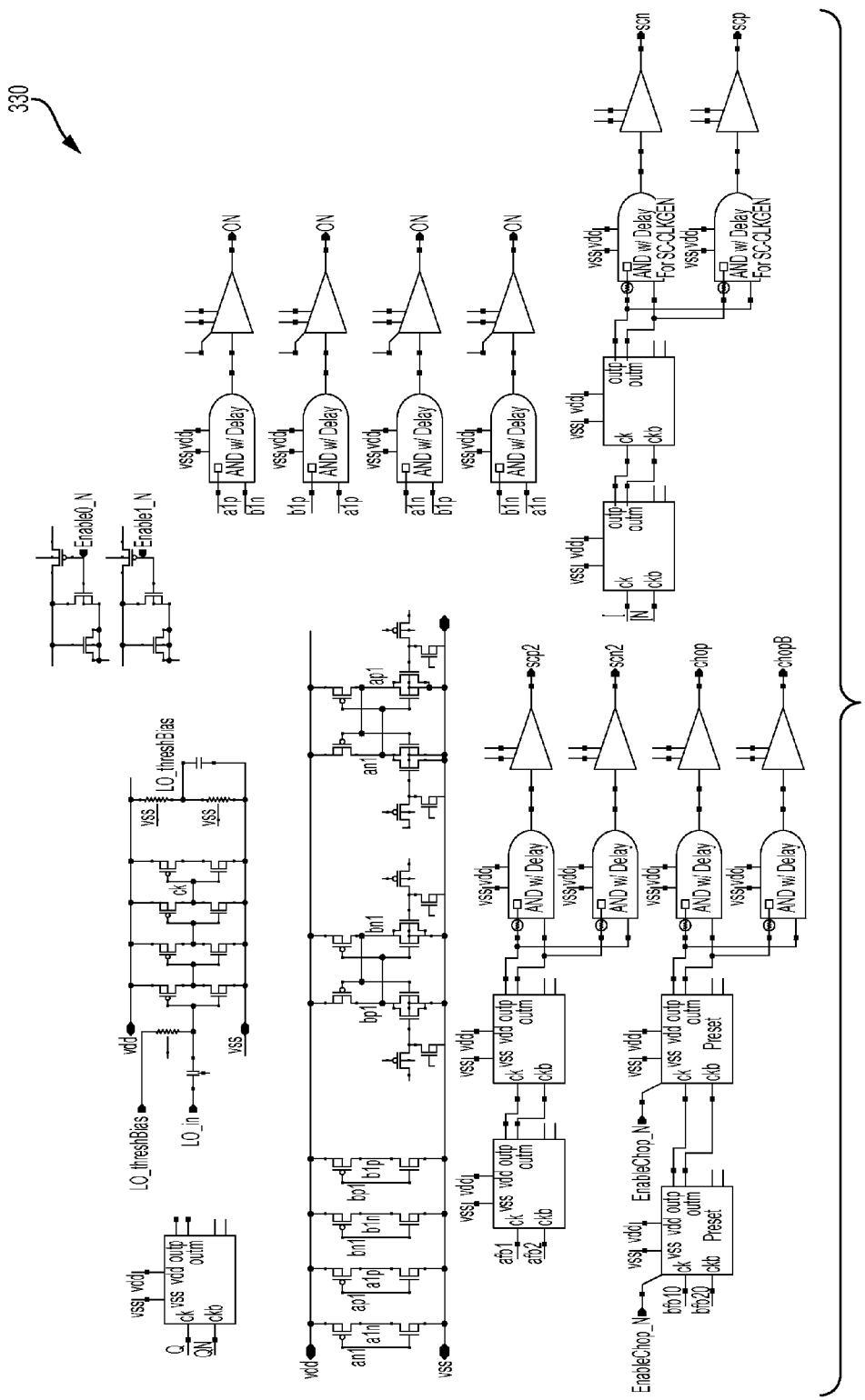

FIG. 4E shows a detailed circuit schematic of clock generator 330 that is operative to generate the clock signals used in the charge pump 310a of FIG. 4A.

Charge-Pump Noise Considerations:

The larger the charge-pump sampling capacitors are made (e.g., capacitors 401-415 and 501-515), the more power may be needed from the radio receiver to drive (i.e., charge and discharge) those capacitors as well as to drive the switches for a constant desired signal bandwidth. Larger capacitors may therefore be combined with larger switches to attain a desired settling precision. The minimum sampling capacitance is set by thermal noise (e.g., kT/C noise) on the differential output capacitors comprising $C_{FILT}$ (e.g., the sample capacitor in FIG. 4A includes two capacitors $C_{FILT}$ in series with each other). Since thermal noise is generally white, it is evenly distributed over the entire sampled bandwidth. Thus, the voltage noise at the output of the first charge-pump 301 from thermal noise equals:

$$\frac{V_n^2}{\text{Hz}} = \frac{kT}{C_{FILT}/2} \times \frac{1}{F_{sample}/2},$$

where $F_{sample}$ is the sample rate of the first charge pump 301. If we assume that the first stage charge pump 301 is sampled at the channel center frequency divided by 4, the sample rate would then be 2.45 GHz/4=612.5 MHz. In general, the first stage sample rate can be set by anti-aliasing and filtering requirements. Then, we find the noise density in the sampled bandwidth of 306.25 MHz is:

$$\frac{V_n^2}{\text{Hz}} = \frac{4 \times 4.111^{-21}}{C_{FILT} \times 612.5^6} = \frac{2.69^{-29}}{C_{FILT}}.$$

We may want to ensure that the thermal noise (e.g., kT/C noise) in the first charge pump 301 is below the thermal noise from the front end by a comfortable margin. To calculate the thermal noise density from the antenna at the output of the first charge pump 301, we assume that there is about 10 dB of gain in the front-end match and a charge pump gain of 8. Thus, the front-end noise, which is that of a 50-Ohm resistor or 0.9 nV/rtHz, is multiplied by about a factor of 24: the port noise is about 25 nV/rtHz at the first charge pump output. For the above equation, this corresponds to an equivalent value of $C_{FILT}$ of 51 fF (i.e. the noise from the front end is equivalent to the kT/C noise on a 51 fF cap). To ensure that the kT/C noise doesn't degrade the NF by more than an arbitrary target of 0.2 dB, we may need the capacitance at the output node to contribute 10% or less of the noise power at the first charge pump output. Thus, $C_{FILT}$ may need to be at least 20 times the equivalent capacitor size from the front-end or 1.0 pF. Note that the minimum capacitance of the second stage is approximately the gain squared (e.g., 64×) times smaller. Depending on the sample rate of the second and subsequent stages (and hence the bandwidth over which the kT/C noise is spread), other considerations such as matching and sensitivity to wiring and other parasitic elements may influence the minimum size selection of $C_{FILT}$.

Charge-Pump Frequency Response:

As described earlier, the charge pumps 301, 303, 305 provide filtering of out-of-band signals. Analysis of the charge pumps may be approximated as follows. For an ideal, single-stage, switched-capacitor charge pump having a gain of N, driven by an ideal voltage source, the bandwidth characteristic is set by the discrete-time transfer function below:

$$\frac{V_{out}(z)}{V_{in}(z)} = \frac{C_1}{(C_1 + C_{FILT}) - C_{FILT}z^{-1}},$$

where $C_1$ is the series combination of the sampling capacitors (e.g., $C_s/N$, where N is the number of sample caps put in series during the present mode), and $C_{FILT}$ is the total differential output capacitance including the filter capacitance at the output of the charge pump.

The above equation relates the output voltage $V_{out}$ to the input voltage $V_{in}$ when the input to the switched-capacitor charge pump (SC-CP) is driven with an ideal voltage source. However, the input to the charge pump is driven by a non-zero impedance (e.g., a mixer output for the first stage 301, buffer outputs for subsequent stages 303, 305 as described later). The SC-CP input impedance reflects the output capacitance of the charge pump times the SC-CP voltage gain squared and, in combination with the prior-stage's output impedance, yields a pole-zero combination that may be at a frequency lower than the value shown in the above equation. Furthermore, in some implementations, the buffers shift the output voltage from ground to about 0.6V. Thus, the switches at the input to the charge pumps have only 0.6 V $V_{GS}$ drive. The increased resistance due to this common mode shift may be thought of as simply adding additional series resistance to the buffer output impedance thereby reducing the bandwidth.

Figure 6:
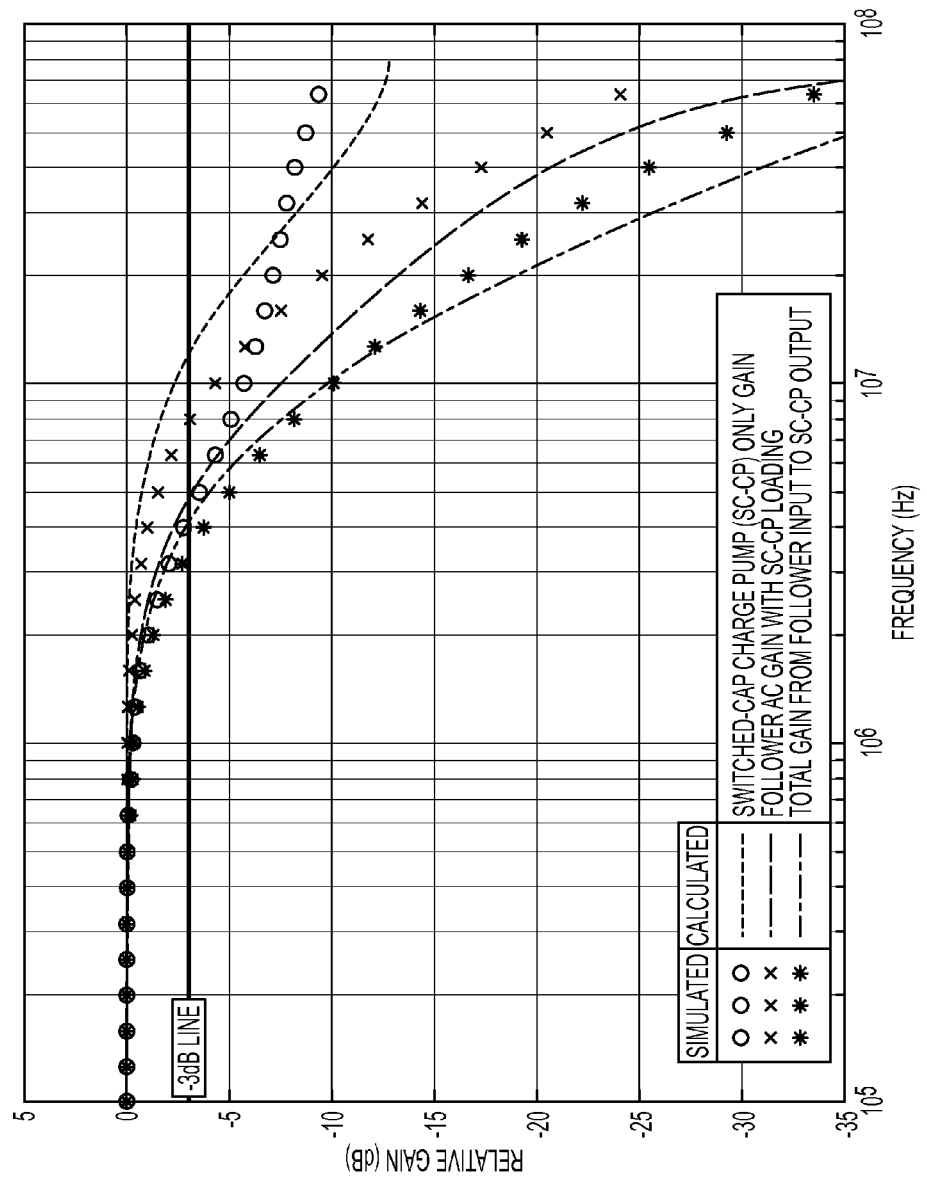

Since the input to the charge pump is driven by a non-ideal voltage source, the circuit can be modelled for estimating frequency response as a discrete time charge pump with a Thevenin-equivalent source driving the input of the SC-CP. This simplification assumes that the two poles are uncoupled and independent. However, the ideal SC-CP gain at higher frequencies drops, resulting in a smaller input-referred loading due to the reduced high-frequency gain. This reduced loading adds a zero in the transfer function from the input to the output. FIG. 6 shows the simulated and calculated frequency response for the ideal switched-cap component, the finite output impedance component, and the combination of both. Even though the ideal SC-CP and the output-impedance induced poles deviate from the approximation, the errors tend to cancel out making the overall approximation relatively good, as shown by the starred line (simulated) and dashed-dotted line (calculated) trace data.

Because the charge pump acts as a transformer, the capacitance looking into the charge pump is the voltage gain of the charge pump squared times the output capacitance. Thus, the amount of gain that can be reasonably attained in a single stage is limited, and is chosen here to equal 8. However, by buffering the filter-capacitor output (e.g., with source-followers, an op-amp in feedback, a trans-conductance amp in feedback, or any other appropriate buffer with a voltage gain less than 1, equal to 1, or greater than 1), the SC-CP stage output impedance may be lowered enough to sufficiently drive additional stages of charge pumps. Additional charge pumps may be configured to provide more gain and filtering, thereby further conditioning the signal. Each gain stage approximates a second-order filter (as explained above), so that the cascade of the three gain stages (e.g., three charge pump stages, as shown in FIG. 3A) provides sixth-order filtering. When combined with the intrinsic, first-order low pass filtering of the passive mixer, excellent rejection of out-of-band (OOB) blockers may be attained. Simulations show OOB attenuation of approximately 100 dB at 100 MHz away from the channel center, although un-modeled parasitic-coupling mechanisms may reduce this number in practice. While the front-end mixers run at the channel center frequency (e.g., 2.5 GHz), the subsequent gain stages may run at a reduced rate to minimize power consumption from driving the switches. For example, in the receiver, the first stage 301 after the mixer was chosen to run at the LO frequency divided by 8 (625 MHz), with the second and third gain stages 303 and 305 run at a rate ¼ this value, or approximately 156.25 MHz (the exact frequency in this embodiment will depend on the channel since the LO frequency varies with the channel). Care should be taken to ensure aliasing components are either properly handled (e.g., through the use of a decimation filter between stages where a downsampling operation occurs) or that they are below a level of concern.

To provide impedance buffering between charge pump gain stages in the radio receiver 300, each of the charge pump stages before the final charge pump state (e.g., each of the first two stages 301, 303 in receiver 300) include buffers to buffer the output voltage on $C_{FILT}$. For example, in the illustrative charge pump of FIG. 3B, the chopper stabilization circuit 312 include buffers 321 and 322 operative to buffer the output voltage on $C_{FILT}$. In other embodiments, the chopper stabilization circuit 312 may be replaced by a buffer stage without including chopper stabilization switches 324 and 325.

In a detailed circuit embodiment shown in FIG. 4D, the buffers (e.g., 321, 322) are implemented using pseudo-differential buffers 450 to buffer the output voltage on $C_{FILT}$. In one embodiment, the buffer 321 is made from complementary source follower transistors 452, 453 that buffer the signal at the output node i1 of switch 324, and provide the buffered signal to the input node o1 of switch 325. In some embodiments the buffers are powered by a step-down, capacitive DC-DC converter because the required dynamic range at the input to the buffer is small in comparison to the supply rails and use of a DC-DC converter improves a power metric (e.g., an efficiency) of the buffer. Since each baseband path (e.g., I- and Q-paths) includes a differential buffer at the output of the first two stages (e.g., 301 and 303), the entire receiver includes four differential buffers in this embodiment.

As detailed above, to alleviate the effect of flicker noise and offset in the inter-stage buffers, chopper-stabilization is used between the filter capacitor and the buffer input. The flicker noise reduction is provided by the chopper stabilization circuit of FIGS. 3B and 3C. An illustrative embodiment of the chopper stabilization circuit is shown in detail in the circuit diagrams of FIGS. 4B and 4C, in which switches 324 are implemented using switches T252, T253, T254, T255 and the switches 325 used to unchop the signal after the buffer are implemented using switches T5, T8, T9, T10 and T201, T123, T124, T125 which form transmission gates able to handle well sampling of a mid-rail common mode voltage. Correlated double-sampling may be used in addition to chopping or, alternately, instead of chopping to address offset and 1/f noise attenuation. Note a small amount of residual charge remains on the follower gate capacitance as the chopping polarity is flipped. This charge is canceled by the reverse polarity configuration. The process of charge cancellation/redistribution realizes a switched-cap resistor, the result being an apparent resistance at the output node of the charge pump. Even though the capacitance at the buffer input and chopping switch nodes may be made small, the equivalent resistance is amplified by the inverse of the gain squared when referred to the input, lowering the impedance substantially. The increased loading on the output of the prior stage has the effect of reducing gain of the followers from the prior stage, as well as reducing the intrinsic gain of the present stage. To reduce the charge cancellation at the buffer input, the switches and buffer may be optimized to trade off settling time/drive capability with the resistive-loss mechanism caused by the chopping. An additional means to reduce the lost gain is to reduce the chopping frequency since the charge is only lost when the chopping polarity switches: halving the chop rate causes a doubling of the equivalent input impedance caused by the chopped buffer. Chopping may be reduced to a low rate with the caveats that: a) The chopping frequency should be greater than the 1/f noise corner of the buffer, and b) There is an equal amount of both + and − chopped signal sampled on the ADC following the analog front end before each conversion (otherwise the flicker noise+offset won't be filtered out and will appear post-ADC conversion as a square wave in the digital domain).

The loading on the LNB 103 by the first gain stage 301 is further increased when two mixers 110, 112 are used (e.g., for a quadrature output), as opposed to a single mixer. In some designs, separate LNBs for the I channel and the Q channel may be used, or cascaded LNBs may be preferred (e.g., one LNB with an input coupled to an antenna having an output, the output of this first LNB coupled to two LNB inputs, the output of these second and third LNBs configured to respectively drive the I and Q channels) to reduce this loading effect.

Since in this illustrative embodiment the buffers 321, 322 are biased continuously, a reservoir capacitor $C_R$ is included to collect charge from the buffer during the portion of the cycle that the charge pump is presenting the sampled value to its filter capacitor. The collected charge on $C_R$ is transferred to the subsequent charge pump during the next sample interval. For example, the reservoir capacitor $C_R$ is illustratively shown in FIG. 4C showing an embodiment of the switches 325. The reservoir capacitor $C_R$ may comprise a common-mode capacitance (e.g., 430), a differential capacitance (432), or a combination thereof. In some embodiments, the buffers are duty cycled so that they are only on for a portion of the cycle, e.g. while the sampling operation occurs.

In integrated circuit embodiments of the SC-CP, the sampling capacitors may be implemented using metal-insulator-metal capacitors (MIMCAPs). The MIMCAPs advantageously provide low bottom-plate capacitance (~0.5%). However, the bottom-plate capacitance causes the gain of the SC-CP to be attenuated due to a capacitive divider effect occurring when the sampling capacitors are placed in series. Alternately, metal-oxide-metal capacitors (MOMCAPs) may be used instead of MIMCAPs. However, the much larger bottom-plate parasitic capacitance of the MOMCAPs to the substrate can cause gain attenuation and increased NF unless addressed.

Figure 7A:
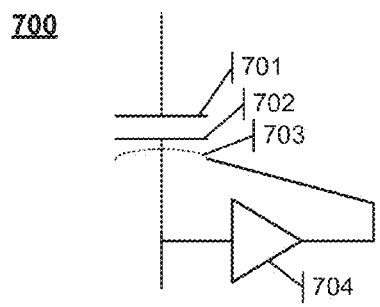
FIGS. 7A-7C are detailed circuit diagrams of capacitor circuits for use in charge pumps such as those shown in FIGS. 3A-3C, 4A-4E, and 5A-5C.
Figure 7B:
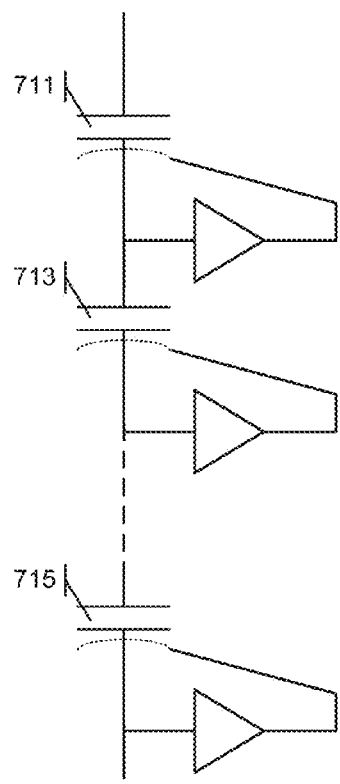
Figure 7C:
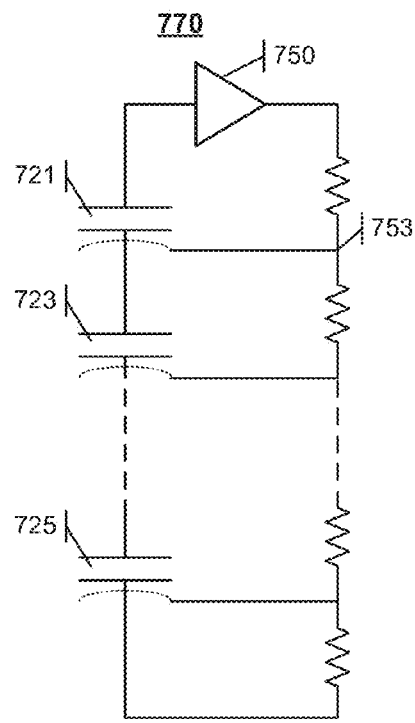

To alleviate some of the issues resulting from parasitic capacitance to the substrate, the bottom plate of the MOMCAP may be shielded as shown in FIG. 7A. Specifically, as shown in FIG. 7A, an integrated circuit capacitor 700 includes an upper plate 701 and a lower plate 702 which may exhibit a parasitic connection to the substrate. To reduce the effect of the parasitic connection to the substrate, a shield 703 may be formed between the lower plate 702 and the integrated circuit substrate. The shield 703 can be formed as a doped well or other region, as a metallization, as polysilicon, or using another appropriate integrated circuit structure. The shield 703 is driven by a unity-gain buffer 704 connected to the bottom plate 702 such that the shield 703 stores a voltage potential that follows the bottom plate voltage. The use of the unity-gain buffer 704 bootstraps the parasitic capacitance to the extent that shield 703 tracks the bottom plate voltage 702. FIG. 7A illustrates one embodiment of a capacitor 700 during sampling phase. FIG. 7B shows multiple capacitors 711, 713, 715 during the present phase. The buffer 704 has a gain of approximately 1 (e.g., buffer 704 is implemented as a source follower or an op-amp in feedback). FIG. 7C illustrates another embodiment of a capacitor bootstrapping circuit. In the other embodiment, the shields of each of the capacitors 721-725 are coupled to the bottom plate voltage during the sampling phase, using a switch or a buffer coupled to a switch for example. After sampling, the sampling capacitors are configured in a second series configuration 770 shown in FIG. 7C to provide gain. In configuration 770, the output of the series connected capacitors 721-725 of the charge pump is buffered by buffer 750, and the buffer output is divided by a resistor divider ratiometrically similar to the capacitors in series. In some embodiments, switched-capacitor equivalents to resistors may be used. The resistor taps (e.g., at 753) are connected to the shields to provide bootstrapping. In some embodiments, node 753 includes a decoupling capacitor. The end result with a bootstrapped-MOMCAP solution will generally have increased power consumption and somewhat worse noise performance; however, this may be an acceptable trade-off for some cost-sensitive applications or in technologies where MIMCAP is not commonly offered.

Charge Pump to Analog-to-Digital Converter (ADC) Interface Stage:

The final output of each path (i.e., I- and Q-paths) is a capacitor at the output of the final charge pump 305. The capacitor may effect a filter capacitor and interfaces to an ADC connected to the output of the radio receiver 300. In some embodiments, a successive approximation register (SAR)-based anti-aliasing ADC (AA-ADC) is used as described in U.S. patent application Ser. No. 13/717,377 filed on Dec. 17, 2012, which is hereby incorporated by reference in its entirety. The AA-ADC samples at the sample rate of the last gain stage (e.g., SC-CP 305) on a first ADC array (156.25 MHz). When the first array has sampled all of its sampling capacitors (e.g., 8 samples, each sample on $1/8^{th}$ the total array capacitance), the conversion process commences on the first array while the second array picks up sampling on the next SC-CP present clock edge. The two AA-ADC arrays alternate sampling and conversion providing an intrinsic decimation-filter plus decimator. For this oversampling rate of 8×, the AA-ADC outputs a digital decimated word at a rate of 156.25 MHz/8=19.53 MHz. In this manner, the out-of-band (OOB) signals are efficiently removed without aliasing and the conversion rate is minimized to the value required to properly handle the desired in-band signal as well as digital filtering requirements for close-in channel rejection (e.g., adjacent/alternate channel rejection). Close-in channel-rejection requirements may call for a digital filter of any appropriate type including finite impulse response (FIR), infinite impulse response (IIR), or a matched filter for the received signal. Depending on the specific signal processing requirements, a 2-tap sine 1 filter (with an optional additional down-sample-by-two operation) may be placed at the AA-ADC digital output and used to compensate for AA-ADC array mismatch (e.g., gain mismatch, offset mismatch): each filtered (or filtered and decimated) AA-ADC sample in this case is the average output of both arrays which places a null in the frequency spectra (i.e. 19.53/2=9.77 MHz for this example) where mismatch would generate a tone.

The SAR-ADC array capacitance may be used to effect the filter capacitor for the last stage in addition to being used for the conversion process. Alternately, a capacitor distinct from the SAR array capacitor, or a combination of the SAR-ADC cap and a distinct filter cap may be used. Since the ADC input is directly coupled to the output of the last gain stage, no ADC input buffers are required in some embodiments. In this case, the last analog buffer in the signal chain is at the input of the last gain stage where the signal is $1/8^{th}$ the magnitude of the signal at the ADC input. Thus, the only components required to handle the full-scale range of the baseband signal are capacitors and switches which easily provide the requisite linearity and dynamic range in a 65 nm process. Note that having a lower gain in the last stage eases buffer driving requirements for driving capacitance due to the square relationship between input-referred capacitance and charge pump gain. Thus, the gain may be partitioned among the various stages (or additional stages added or removed) to optimize the requirements for any particular design.

In some embodiments, an additional amplifier may be coupled between the last SC-CP stage and the ADC input.

In one embodiment, the target ADC resolution is chosen to be 12 bits. The substantial charge-pump filtering and the use of an anti-aliasing ADC to sample the final charge pump means that the ADC only has to handle the dynamic range of the desired signal plus close-in interferers (e.g., interferers in the ADC sample bandwidth (fs/2), interferers in 2× the bandwidth of the ADC sample rate since aliasing starts to fold the signal back on itself at the ADC sample bandwidth and does not reach the channel center until the sample frequency); farther-away signals are attenuated before the ADC conversion process commences. For a supply of 1.2V and differential inputs 12 bits translate to an LSB of approximately 500 uV differential (2.4 V input differential, $V_{pp}/2^{12}$). Because the quantization level is relatively large, the ADC array total capacitance to attain kT/C noise <<1 LSB is easy to attain. By choosing 1 pF×2 (series combo)=0.5 pF, differential sampling capacitance kT/C would be about 90 uV RMS which is a suitable value satisfying both a) thermal noise requirements as well as b) preventing excessive loading of the final charge pump. To ensure that the thermal noise floor from the receiver is the limiting factor for sensitivity (e.g., not the ADC quantization noise floor), there should be enough gain in the forward path of the receiver to ensure that the front-end noise is dominant at the ADC. With the three gain stages as described above, the thermal noise density at 1 MHz is about 500 nV/rtHz at the receiver output for one embodiment, with an integrated noise power from 100 kHz to 10 MHz of about 800 uV RMS. This is substantially higher than the quantization noise floor (which is sqrt((500 uV)$^2$/12) or about 150 uV RMS); thus, we should be limited by the radio's front-end thermal noise, as desired.

In some embodiments, higher-resolution ADCs may be used with less gain between the passive mixer and the ADC. In this case, the higher number of bits may be used to expand the dynamic range at the bottom end, absorbing the "gain" into the ADC; being able to resolve smaller signals allows the ADC to be placed closer to the passive mixer, even directly coupled to the mixer output. A high-dynamic range (e.g., 18 bit-20 bit) anti-aliasing ADC directly connected to the mixer output would have substantial advantages in terms of linearity and dynamic range. The LNB/passive mixer architecture has exceptional capacitance driving capability, which should make this type of receiver efficient and architecturally appropriate for current and future deep-submicron processes.

In some embodiments another ADC type is used (e.g. delta-sigma, flash, pipeline, integrating, etc.).

AGC Control:

Gain adjustment (e.g., automatic gain control, or AGC) in the forward path may be needed because the input dynamic range of the radio should span from thermal noise (about −110 dBm in a 1 MHz bandwidth (BW)) to 0 dBm, and the ADC is only 12 bits (~70 dB). Therefore, an additional dynamic range of at least 40 dB may be needed. Gain adjustment may be attained without adversely affecting the desirable filtering characteristics of the signal path by sampling the input of the gain stages on only a subset of the sampling capacitors during the "sampling" phase of operation, and then connecting all eight capacitors in series during the "present" phase of operation. For example, if all eight capacitors are sampled in parallel and then placed in series, the gain of the SC-CP would be 8. However, if only four capacitors sample the input signal and the other four have their charge removed (e.g., the other capacitors are shorted during the sample phase), then the gain of the SC-CP is reduced to 4 when all eight caps are placed in series for the "present" phase of operation. Since all eight capacitors are still connected in series during the "present" phase, the bandwidth of the SC-CP will remain constant even as the gain changes. As detailed above, FIG. 5A shows an embodiment of a variable gain SC-CP in which signals gainB0 and gainB1 provide a two bit control on the variable gain of the charge pump. Note, however, that in the configuration in which only four capacitors are used during the sampling phase, the input impedance of the gain stage will be increased (as compared to times when the gain is set to eight) because only four of the capacitors are presented to the prior stage buffer instead of the full eight capacitors. This variable loading of the prior-stage buffer output can cause a functional dependence of the bandwidth on the AGC level. To reduce this variation in loading, dummy capacitors may be used to replace shorted capacitors in the gain stage used for sampling to keep the load presented to the prior stage constant independently of how many capacitors are being sampled in the gain stage. The dummy capacitors are presented to the follower output (e.g., in parallel with the four selected charge-pump capacitors) during the sample phase. However, the dummy caps are then shorted to ground during the present phase. Alternately, the drive strength of the buffers may be adjusted (e.g., reduced in response to lowered gain) to maintain a more constant bandwidth.

Each gain stage may have logic to select from one to all eight capacitors for sampling, thereby allowing each gain stage to be arbitrarily set to any integer multiple of capacitors. By cascading the three stages 301-305 sequentially, the dynamic range can be controlled from a gain of 1 to a gain of 8*8*8=512 via selecting the number of capacitors to be sampled in each stage; this is an additional dynamic range of about 54 dB. Furthermore, since the gain is set by capacitor ratios the stability of the gain of the charge pumps over process, voltage, temperature, and mismatch should be exceptional. Variation in the front-end matching network (e.g., center frequency, insertion loss, etc.) and LNB performance characteristics will add additional variation to the total signal chain.

The mixer (110, 112) and the first two gain stages (301, 303) may be configured with their common-mode voltage set to ground. By choosing a common-mode equal to ground, only a single-flavored switch (e.g., NMOS only, PMOS only, E-mode pHEMT only, etc.) may be required for low on-resistance. The use of a single-flavored switch reduces the power needed to drive the switches. A common mode of ground also has the advantage that the reference voltage (ground) is stable and intrinsic. The principal concern with a common mode around ground is that large input signals can cause diode junctions in the switches to forward bias (due to the tiny switch sizes, junction-cap nonlinearity is less of a concern because the capacitance of the junctions/ switches is much less than the desired capacitance of the charge pump in some embodiments). The full scale swing of the ADC is between 0 and 1.2 V which is only seen at the output of the last gain stage. Thus, the last stage can operate at a common-mode voltage of 0.6 V to maximize swing; thus, the $V_{GS}$ across the switches is nominally 0.6 V. This small gate-drive results in substantially higher-resistance switches, especially at low temperature. Choosing low-$V_T$ switches or charge-boosted clock signals can alleviate this effect. The input to the last stage (e.g., last buffer in the charge-pump chain) has a maximum swing of approximately $\frac{1}{8}^{th}$ the full-scale output, or 150 mV$_{0-p}$, which is well below the level when the body-junction diodes are forward biased. To avoid forward-biasing the junctions under high-input conditions, the AGC algorithm may reduce front-end gain first, moving towards the back, with the gain of the last stage decreased only after the two earlier stages have reduced their gain to 1 or less.

Applicability to Alternative Front-End Receivers:

While the discussion above has focused on illustrative radio receivers including a LNB 103 in the front-end, the radio receivers need not include a LNB in the front end. More generally, in some embodiments, radio receivers may more generally include an antenna, a buffer, and a passive mixer as described herein. The radio receivers can also include one or more of:

a low noise amplifier (LNA) in the front-end, such as a LNA coupled between the antenna 102 and the mixers 110, 112;

a transconductor connected as part of a passive mixer architecture;

a purely passive architecture; and/or any other appropriate frequency conversion element.

In these cases, the mixer output may be directly coupled to the input of the first SC-CP or may be buffered by an amplifier having a gain of less than 1, a gain of 1, or a gain of more than 1 with an output impedance of the buffer being lower than the input impedance of the buffer depending on the design requirements of the receiver as well as the mixer output impedance.

Furthermore, the principles and circuits described above may be used in architectures where the input signal is frequency converted using an active mixer, a diode mixer, a passive mixer, a single-balanced mixer, a double-balanced mixer, an unbalanced mixer or any other appropriate mixer or front-end architecture.

Example Simulation Results:

The radio receiver described above in relation to FIGS. 3A-3C, 4A-4E, and 5A-5C was simulated and the results of the simulations are presented here.

Figure 8A:
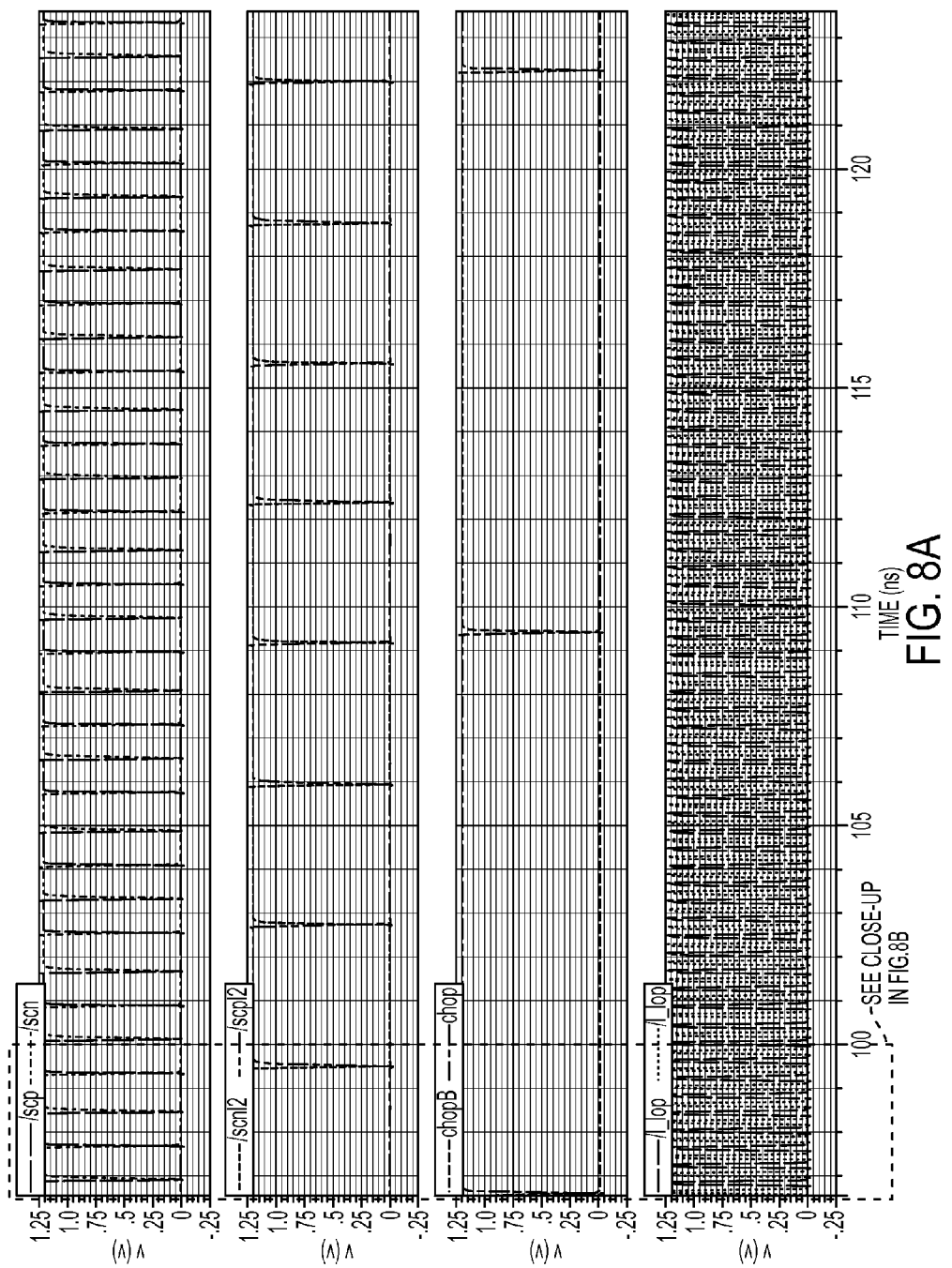
Figure 8B:
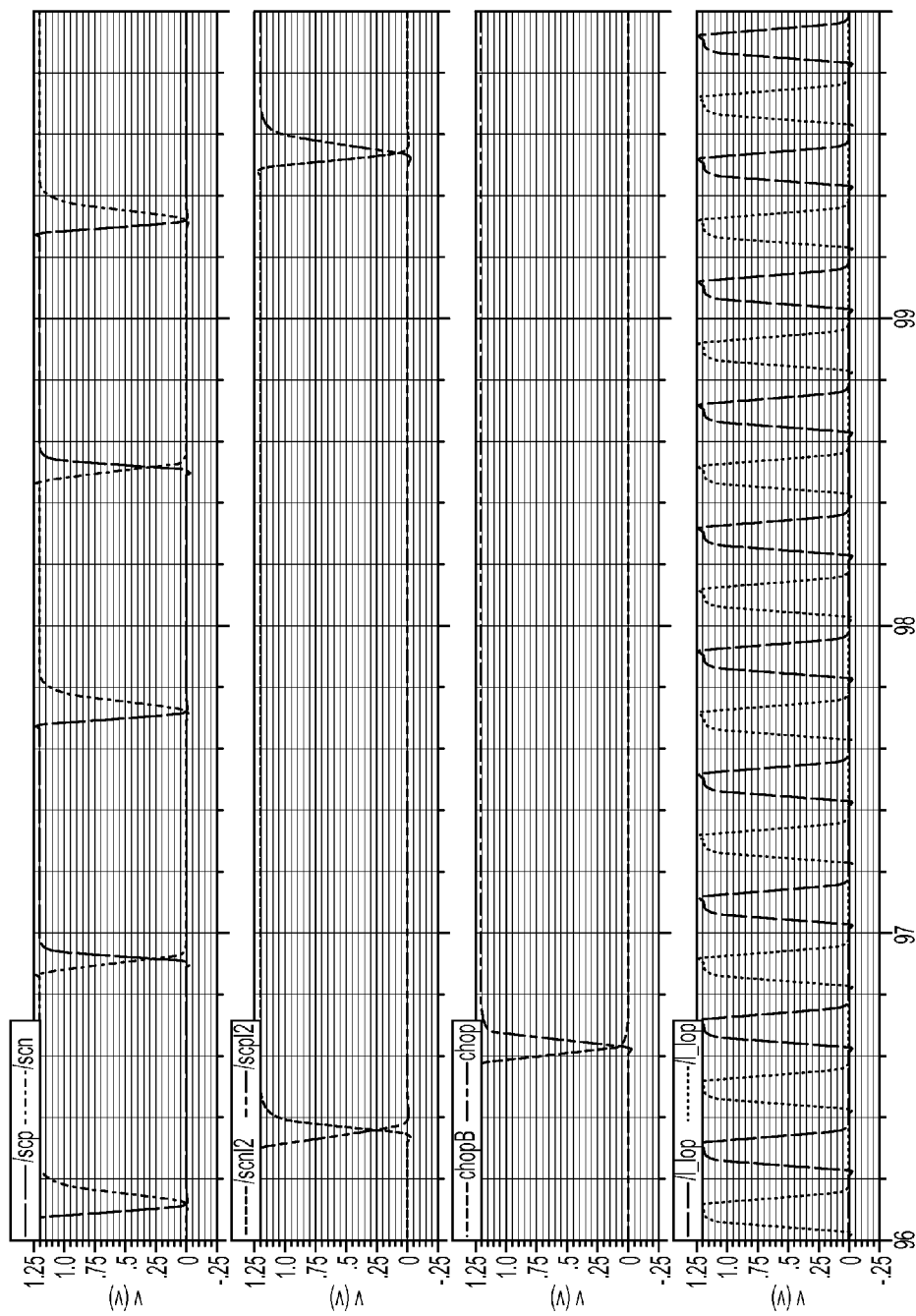

FIGS. 8A and 8B show clocking signals generated by clock generator block 330.

Figure 8C:
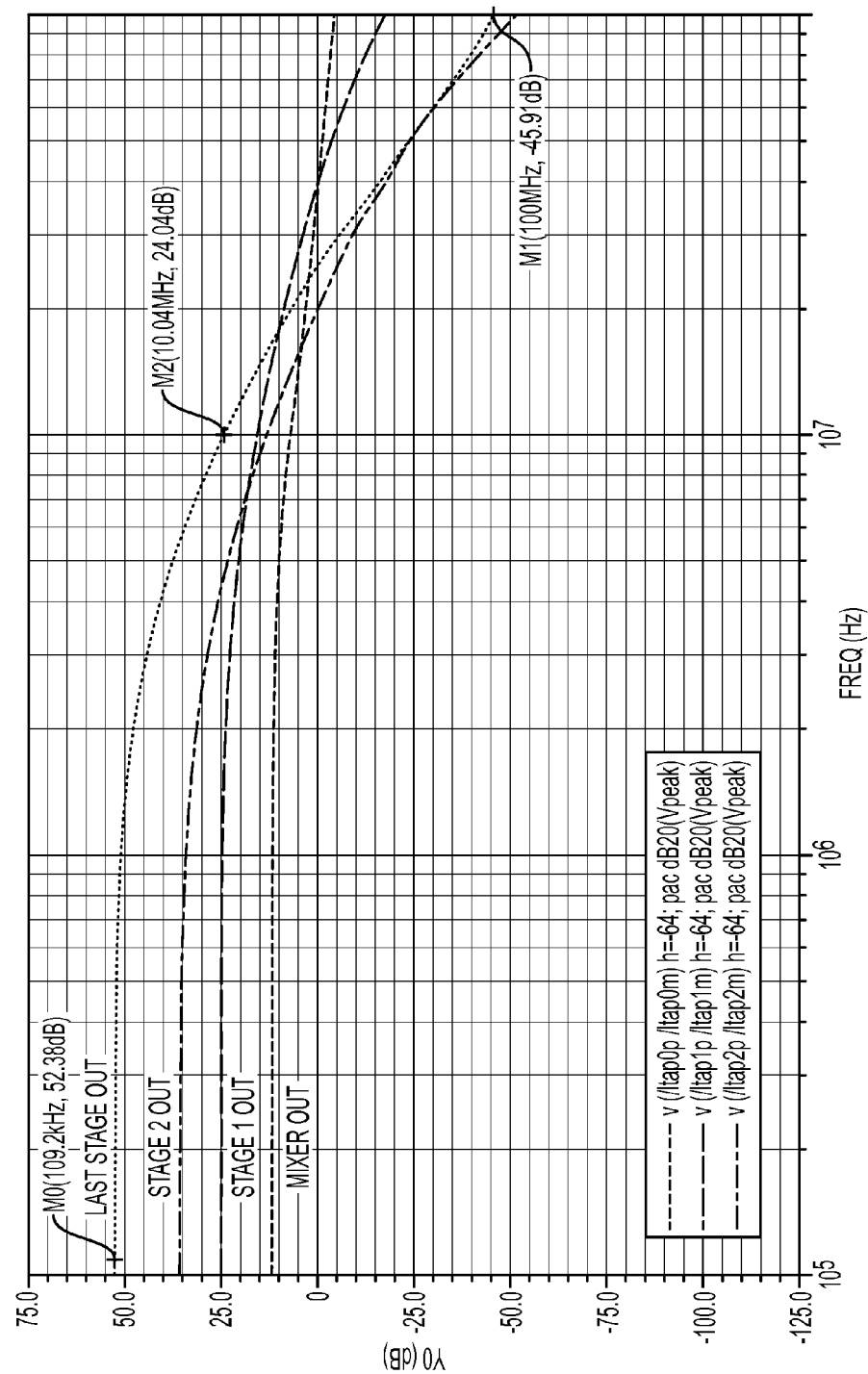
Figure 8D:
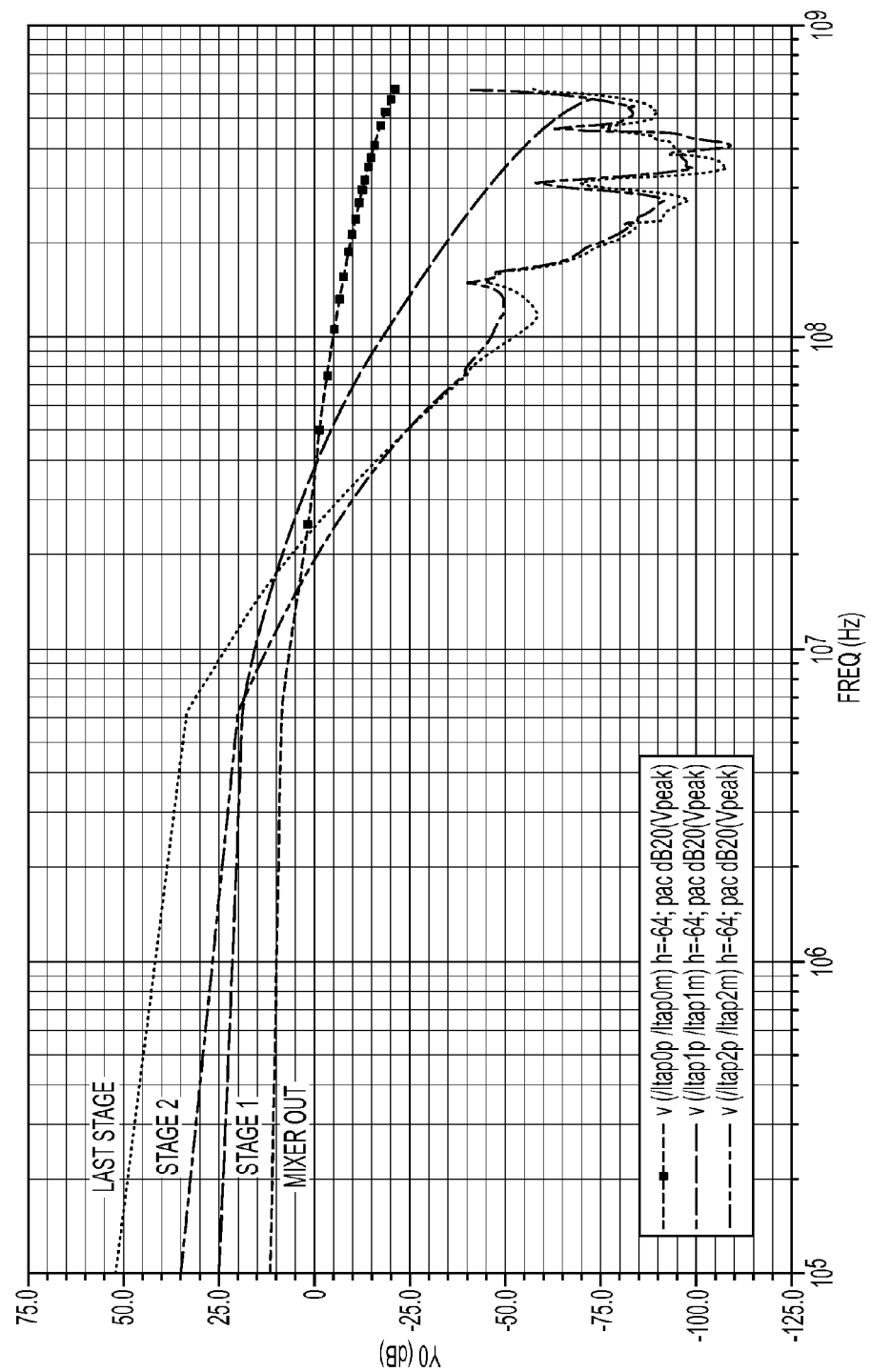

FIG. 8C shows the periodic AC response (PAC) of various points along the receiver chain from the antenna input to the I-channel output (Last Stage Out). FIG. 8D shows the PAC response of the receiver over a larger bandwidth with sweep frequencies chosen for improved resolution at aliasing frequencies.

Figure 8E:
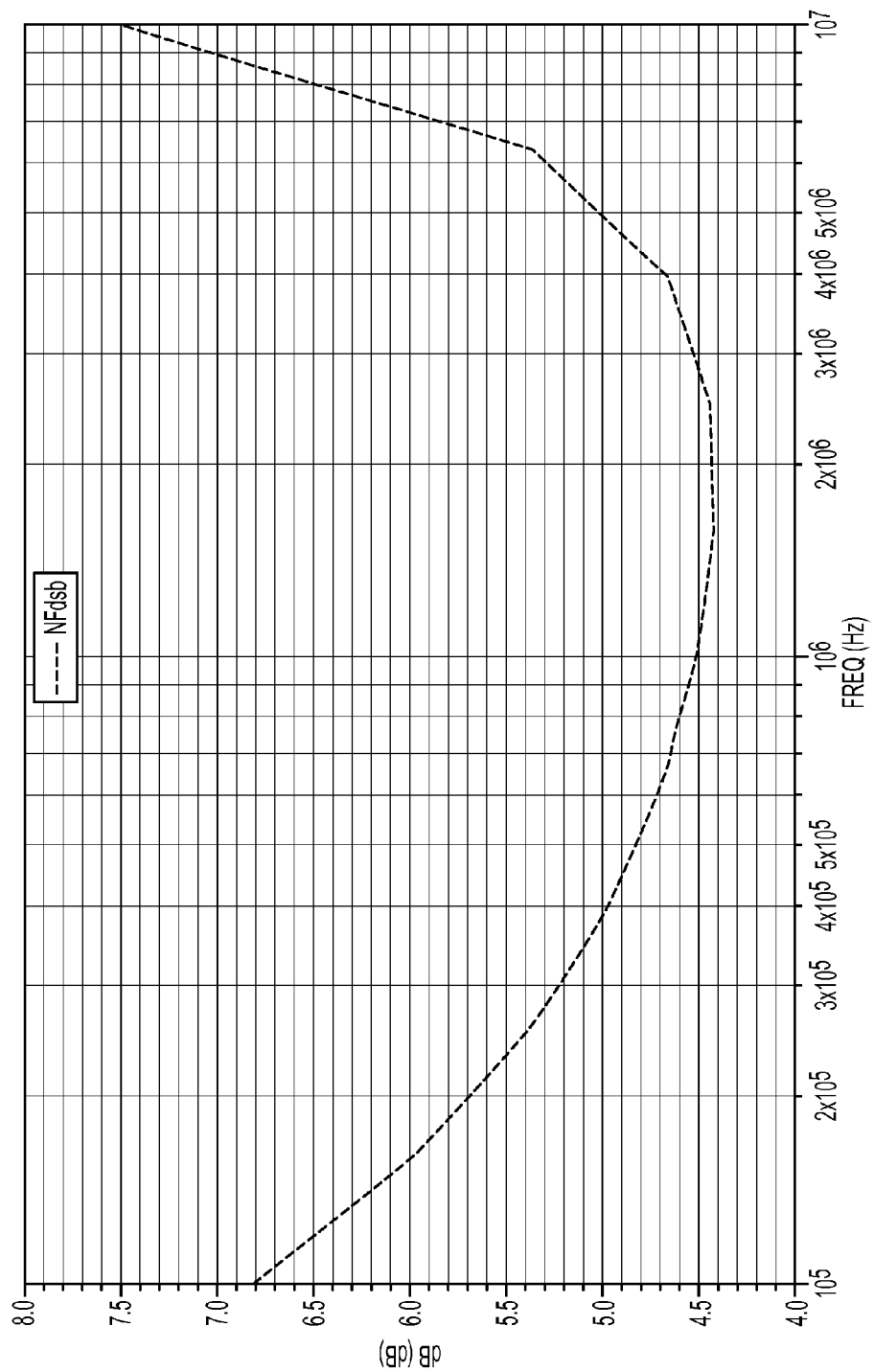

FIG. 8E shows the double-sideband (DSB) NF of the I-channel output at the end of the signal chain at the point where the ADC would sample the receiver output.

FIG. 8F is a table of the top noise contributors to the noise figure and show the various noise contributors for the NF at 1 MHz.

FIG. 8G shows the 1 dB compression point for a blocker at 100 MHz offset from the channel center.

Figure 8H:
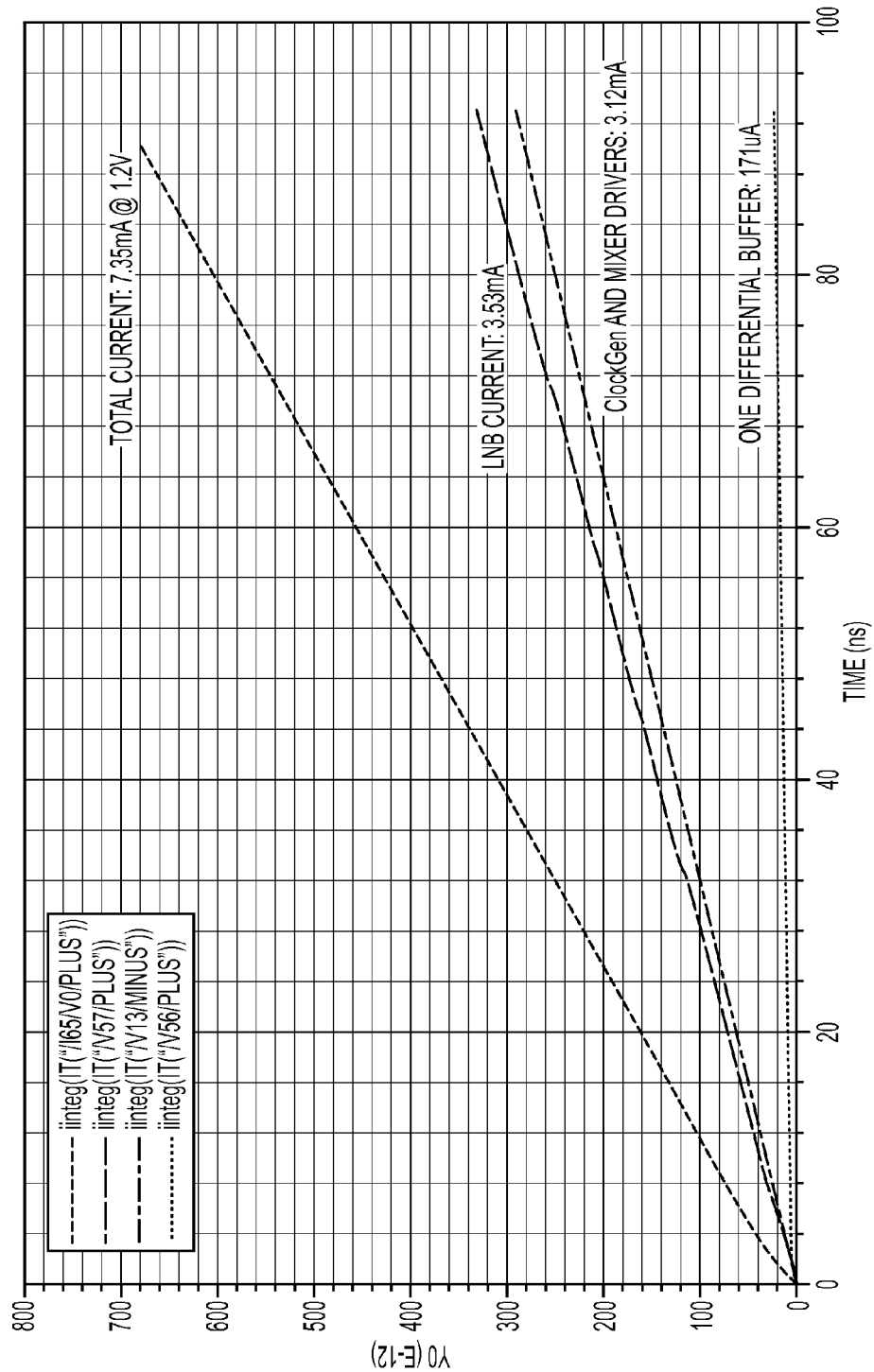

FIG. 8H shows the fractional current consumed by the LNB (3.53 mA), the fractional current consumed by the clock generator and quadrature-mixer driver (3.12 mA), and the fractional current consumed by a single differential buffer (171 uA). The entire receiver from the antenna input to the Quadrature outputs presented for ADC conversion consume 7.35 mA @ 1.2 V, corresponding to 8.8 mW.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A radio receiver comprising:
   an antenna configured to receive a signal;
   a first mixer coupled to the antenna and configured to output a first mixer output signal based on the signal received by the antenna;
   a buffer having a buffer input coupled to an output of the first mixer and configured to output at a buffer output a buffer signal based on the first mixer output signal; and
   a first charge pump coupled to the buffer output and configured to produce a first charge pump output signal based on the buffer signal.

2. The radio receiver of claim 1, further comprising:
   a second charge pump coupled to the output of the first mixer and configured to produce a second charge pump output signal based on the first mixer output signal, wherein the buffer input is coupled to an output of the second charge pump and the buffer is configured to output at the buffer output the buffer signal based on the second charge pump output signal that is itself based on the first mixer output signal.

3. The radio receiver of claim 2, wherein the first and second charge pumps are switched-capacitor charge pumps each comprising a plurality of sampling capacitors.

4. The radio receiver of claim 3, wherein the second charge pump is configured to sample the first mixer output signal on each of the plurality of sampling capacitors of the second charge pump on a periodic basis during a sampling time interval, and to reconfigure the plurality of sampling capacitors in series at an output of the second charge pump on the periodic basis during an output time interval.

5. The radio receiver of claim 2, wherein the first mixer, the first charge pump, and the second charge pump each receive a differential signal at an input thereof and output a differential signal at an output thereof.

6. The radio receiver of claim 5, further comprising:
   a chopper stabilization circuit coupled between the output of the second charge pump and an input of the first charge pump and comprising the buffer.

7. The radio receiver of claim 2, further comprising:
   a third charge pump coupled to an output of the first charge pump and configured to produce a third charge pump output signal based on the first charge pump output signal,
   wherein at least one of the first, second, and third charge pumps has an adjustable gain.

8. The radio receiver of claim 7, wherein the third charge pump has the adjustable gain,
   the third charge pump has a plurality of sampling capacitors, and
   the third charge pump is configured to sample the first charge pump output signal on a selectable subset of the plurality of sampling capacitors selected according to a value of the adjustable gain, and to connect all of the plurality of sampling capacitors in series at an output of the third charge pump during an output time interval.

9. The radio receiver of claim 1, wherein the first charge pump further comprises a capacitive circuit having an adjustable capacitance that is coupled between a plurality of sampling capacitors of the first change pump and the output of the first charge pump, wherein the adjustable capacitance is configured to be adjusted to adjust a bandwidth of the first charge pump.

10. The radio receiver of claim 1, further comprising:
    a second mixer coupled to the antenna and configured to output a second mixer output signal based on the signal received by the antenna,
    wherein the first mixer output signal is an in-phase component of the signal received by the antenna and the second mixer output signal is a quadrature-phase component of the signal received by the antenna; and
    a second charge pump coupled to an output of the second mixer and configured to produce a second charge pump output signal based on the second mixer output signal.

11. A method comprising:
    receiving a wireless signal in an antenna;
    mixing the signal received by the antenna to produce a first mixer output signal in a first mixer coupled to the antenna;
    buffering a signal based on the first mixer output signal in a buffer coupled to an output of the first mixer; and processing the buffered signal in a first charge pump coupled to an output of the buffer to produce a first charge pump output signal based on the buffered signal.

12. The method claim 11, further comprising:
processing the first mixer output signal in a second charge pump coupled to the output of the first mixer to produce a second charge pump output signal based on the first mixer output signal,
wherein the buffering of the signal based on the first mixer output signal comprises buffering the second charge pump output signal that is itself based on the first mixer output signal.

13. The method of claim 12, wherein the processing of the first mixer output signal comprises processing the first mixer output signal in a second switched-capacitor charge pump comprising a plurality of sampling capacitors, and the processing of the buffered signal comprises processing the buffered second charge pump output signal in a first switched-capacitor charge pump comprising a plurality of sampling capacitors.

14. The method of claim 13, wherein the processing of the first mixer output signal in the second switched-capacitor charge pump comprises:
sampling the first mixer output signal on each of the plurality of sampling capacitors of the second charge pump on a periodic basis during a sampling time interval, and
reconfiguring the plurality of sampling capacitors in series at an output of the second charge pump on the periodic basis during an output time interval.

15. The method of claim 12, wherein the mixing of the signal received by the antenna comprises producing a first mixer output signal that is a differential signal from the signal received by the antenna that is a single-ended signal.

16. The method of claim 15, wherein the buffering of the second charge pump output signal in the buffer further comprises processing the second charge pump output signal using a chopper stabilization circuit comprising the buffer.

17. The method of claim 12, wherein the processing of the mixer output signal in the second charge pump further comprises adjusting a bandwidth of the second charge pump by adjusting a capacitance of a capacitive circuit of the second charge pump that has an adjustable capacitance and that is coupled between a plurality of sampling capacitors of the second change pump and the output of the second charge pump.

18. The method of claim 12, further comprising:
processing the first charge pump output signal in a third charge pump coupled to an output of the first charge pump to produce a third charge pump output signal based on the first charge pump output signal,
wherein the processing of the first charge pump output signal in the third charge pump comprises adjusting an adjustable gain of the third charge pump.

19. The method of claim 18, wherein the third charge pump has a plurality of sampling capacitors, and
wherein the processing of the first charge pump output signal in the third charge pump comprises:
sampling the first charge pump output signal on a selectable subset of the plurality of sampling capacitors selected according to a value of the adjustable gain, and
connecting all of the plurality of sampling capacitors in series at an output of the third charge pump during an output time interval.

20. The method of claim 11, further comprising:
mixing the signal received by the antenna to produce a second mixer output signal in a second mixer coupled to the antenna,
wherein the first mixer output signal is an in-phase component of the signal received by the antenna and the second mixer output signal is a quadrature-phase component of the signal received by the antenna; and
processing the second mixer output signal in a second charge pump coupled to an output of the second mixer to produce a second charge pump output signal.

* * * * *